(12) United States Patent
Sasaki

(10) Patent No.: US 8,212,314 B2
(45) Date of Patent: Jul. 3, 2012

(54) SEMICONDUCTOR DEVICE AND METHOD FOR MANUFACTURING THE SAME

(75) Inventor: Yuji Sasaki, Kagoshima (JP)

(73) Assignee: Sony Corporation, Tokyo (JP)

( * ) Notice: Subject to any disclaimer, the term of this patent is extended or adjusted under 35 U.S.C. 154(b) by 97 days.

(21) Appl. No.: 12/869,952

(22) Filed: Aug. 27, 2010

(65) Prior Publication Data

US 2011/0057256 A1 Mar. 10, 2011

(30) Foreign Application Priority Data

Sep. 4, 2009 (JP) ................. 2009-204662

(51) Int. Cl.
*H01L 27/108* (2006.01)
(52) U.S. Cl. ........ 257/330; 257/329; 257/331; 257/332; 257/268; 257/E29.262
(58) Field of Classification Search .................. 257/329, 257/330, 331, 332, E29.262; 438/268
See application file for complete search history.

(56) References Cited

FOREIGN PATENT DOCUMENTS

JP 07-007154 1/1995

*Primary Examiner* — Tan N Tran
(74) *Attorney, Agent, or Firm* — SNR Denton US LLP

(57) ABSTRACT

A semiconductor device includes a first conductive type semiconductor substrate; a first conductive type semiconductor region provided thereon in which first conductive type first pillar regions and second conductive type second pillar regions alternately arranged; second conductive type second semiconductor regions provided on second pillar regions in an element region to be in contact with first pillar regions therein; gate electrodes each provided on adjacent second semiconductor regions and on one of the first pillar region interposed therebetween; third semiconductor regions functioning as a first conductive type source region provided in parts of the second semiconductor regions located under side portions of the gate electrodes; and a second conductive type resurf region which is a part of a terminal region surrounding the element region and which is provided on first pillar regions and second pillar regions in the part of the terminal regions.

13 Claims, 18 Drawing Sheets

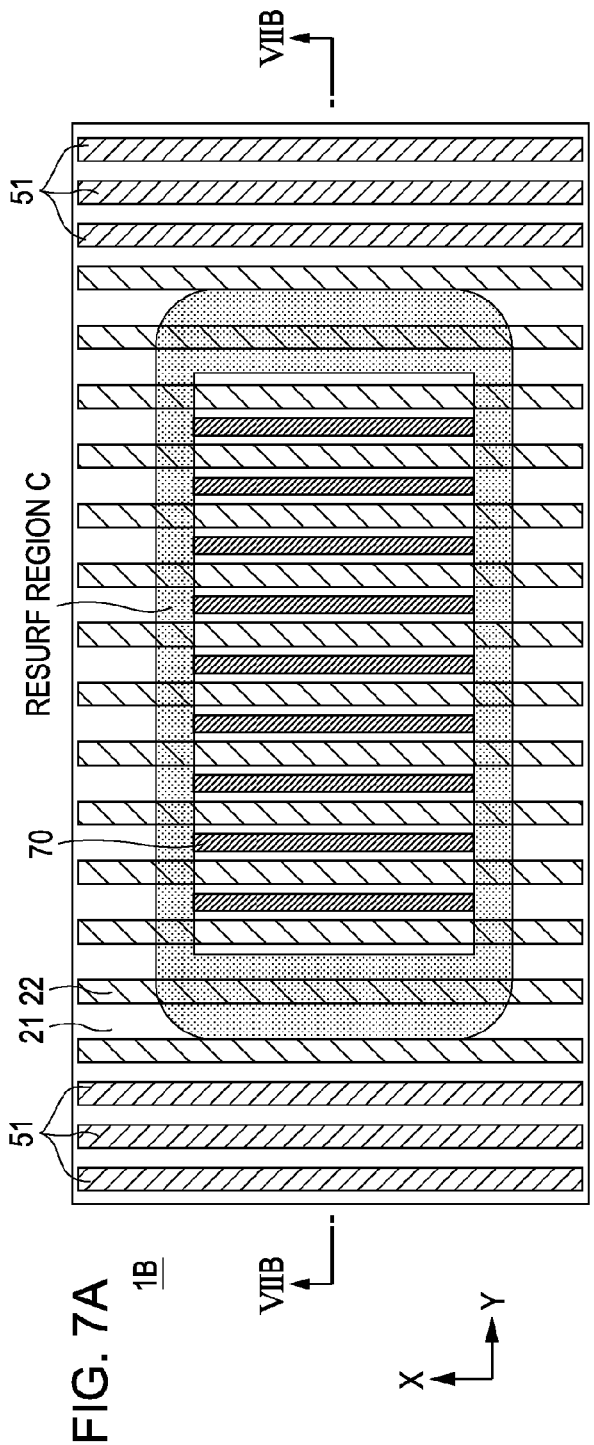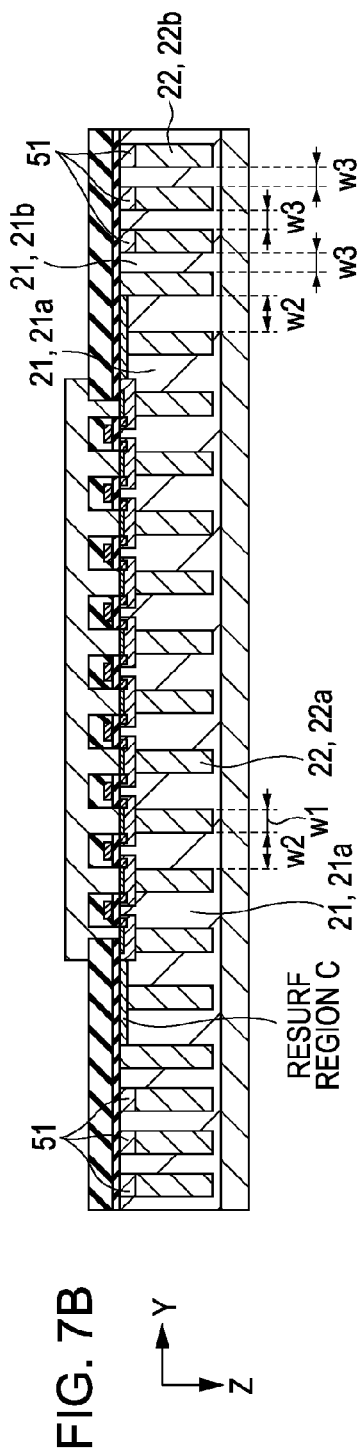

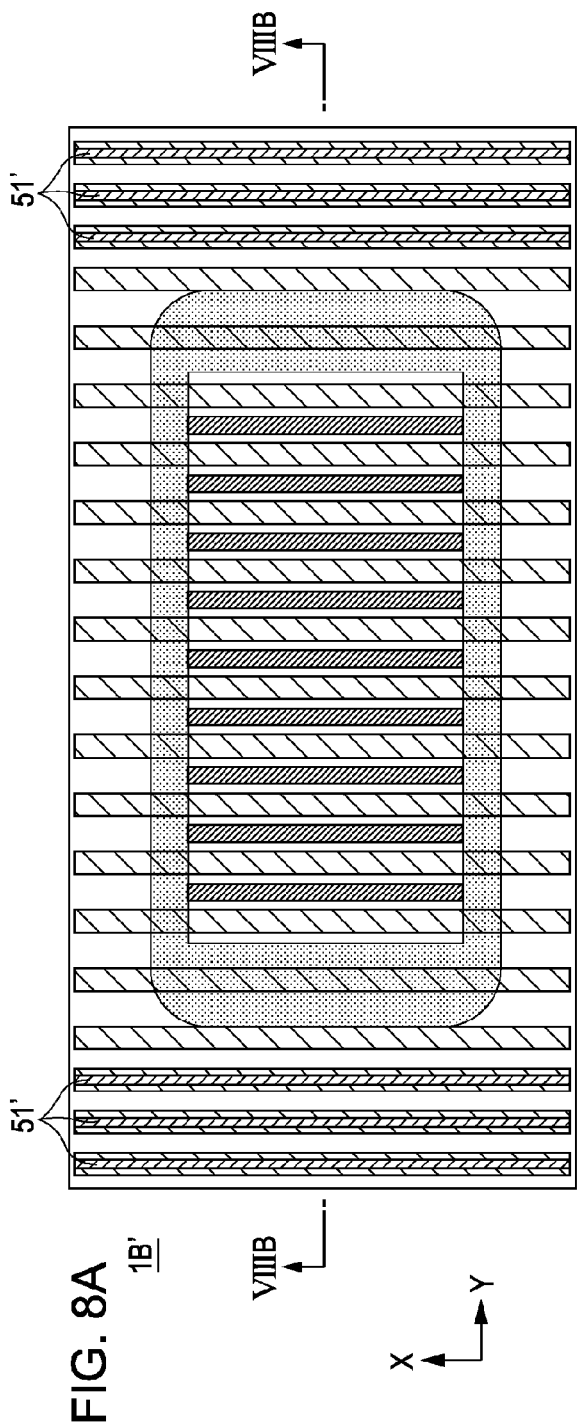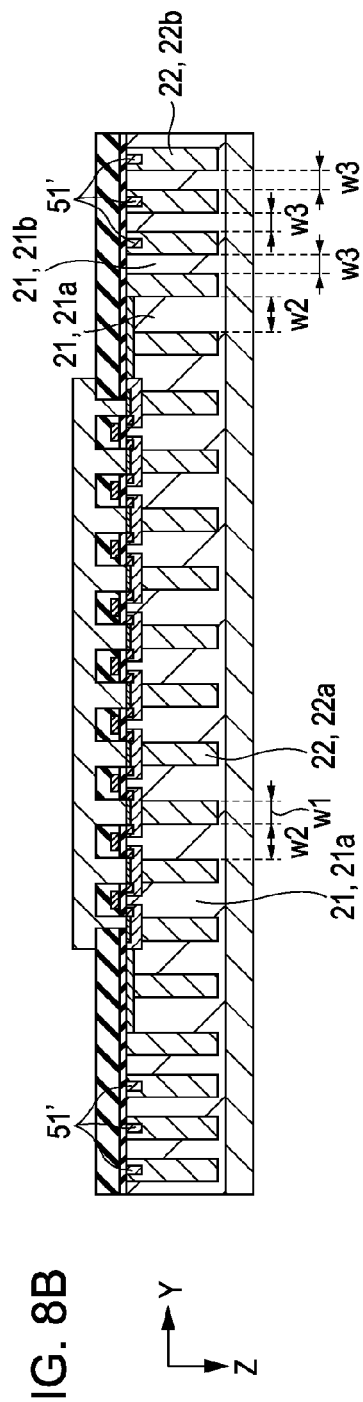

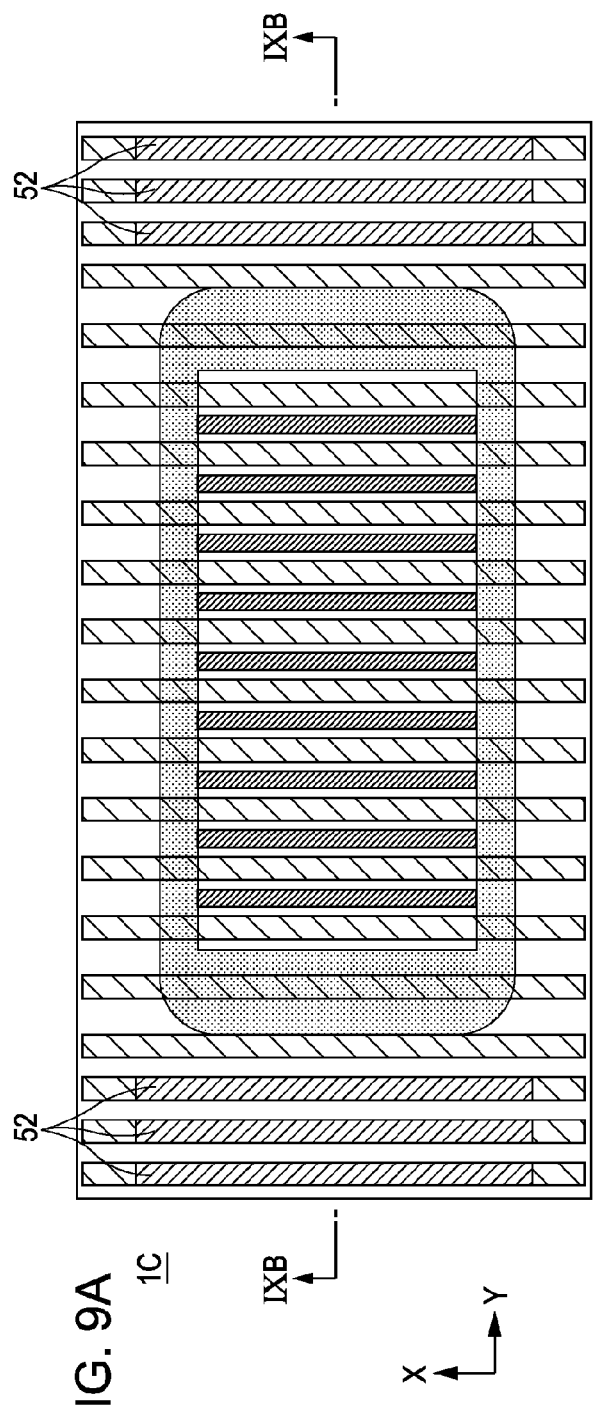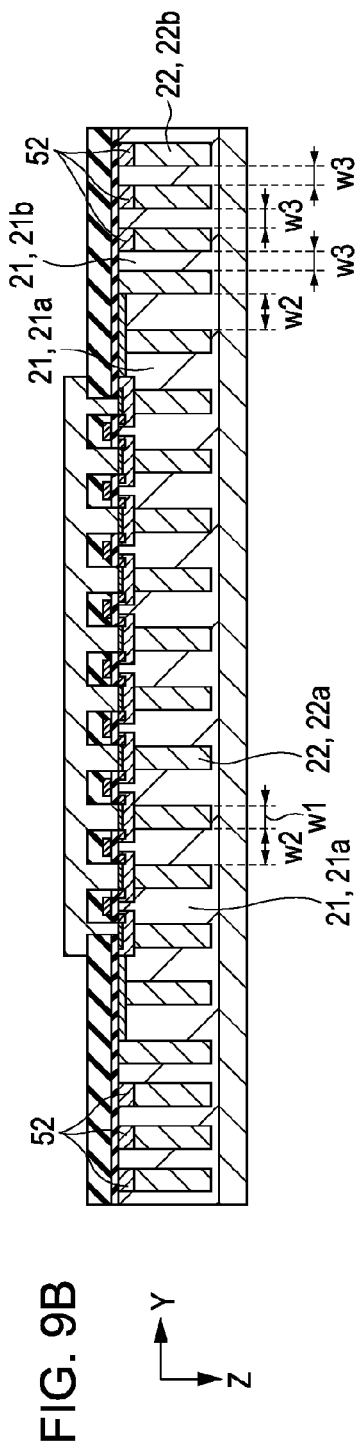

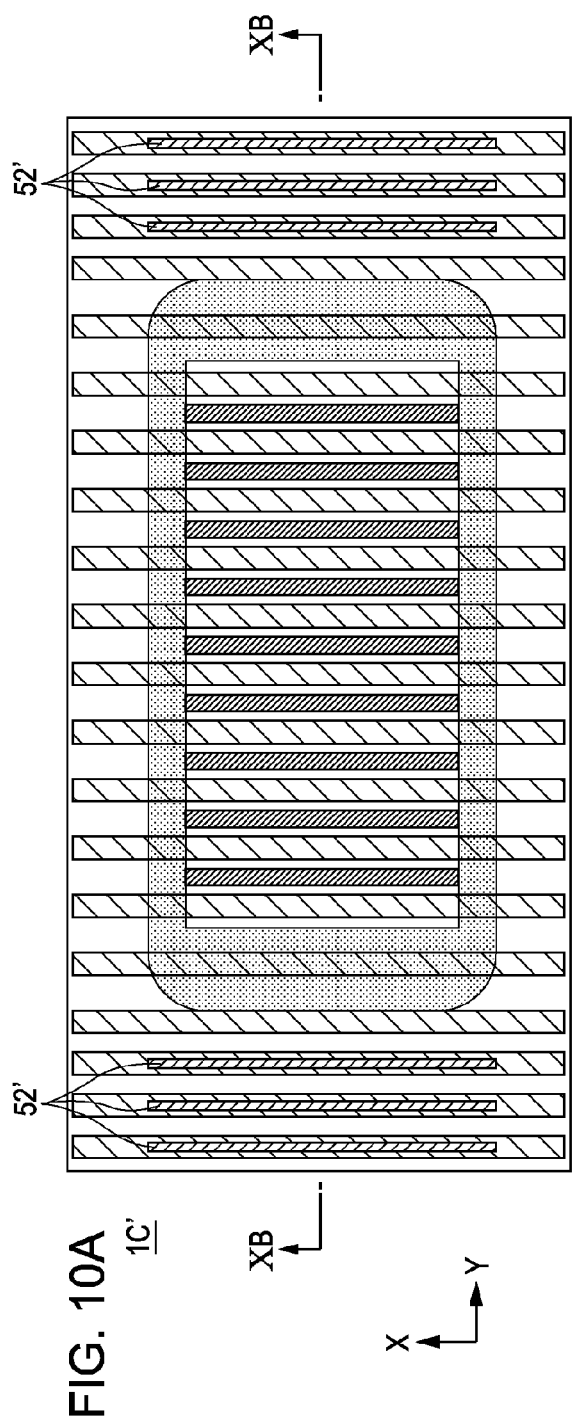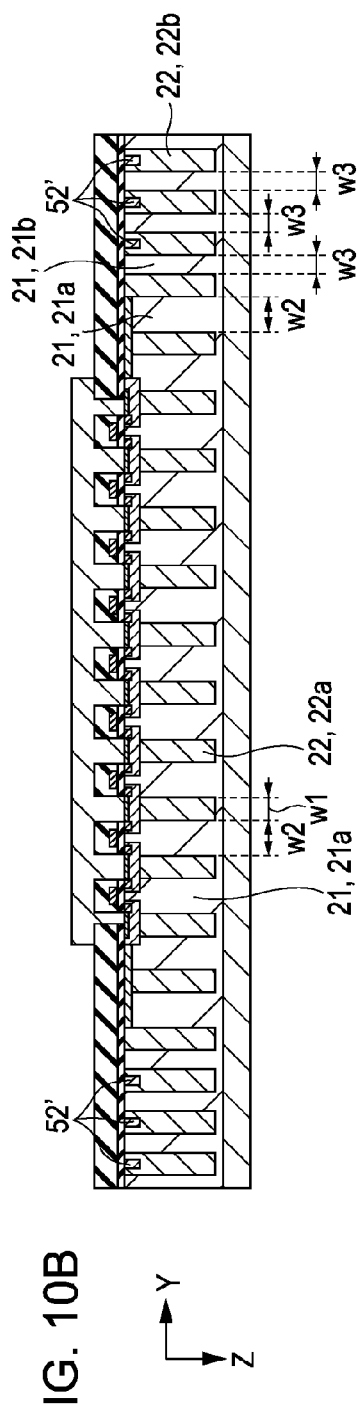
FIG. 10A
FIG. 10B

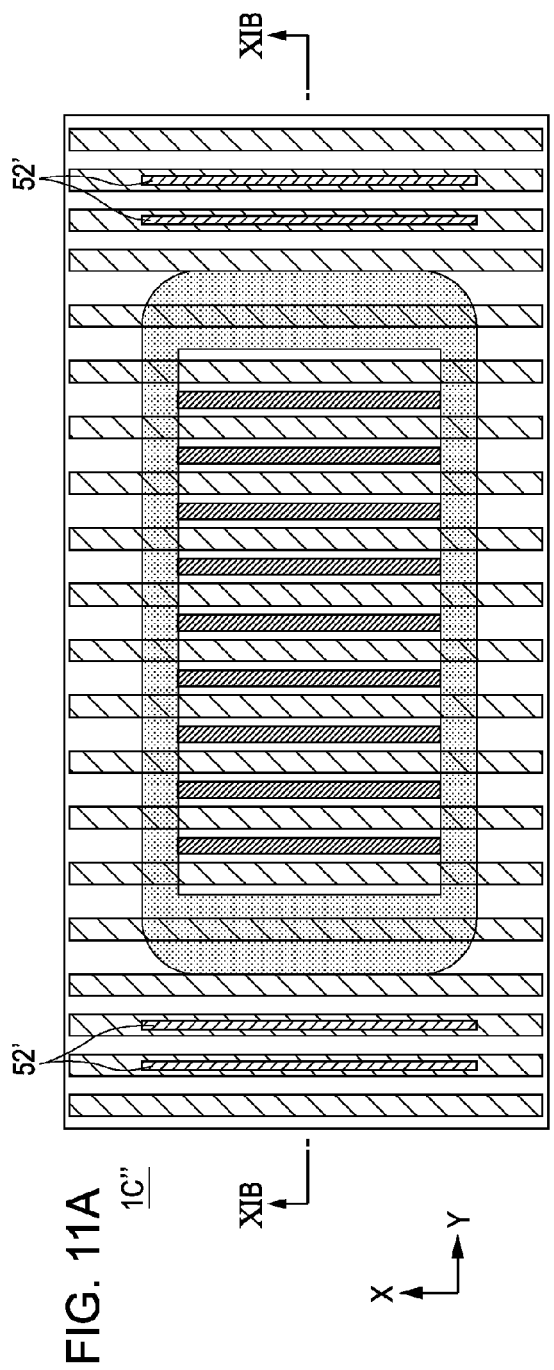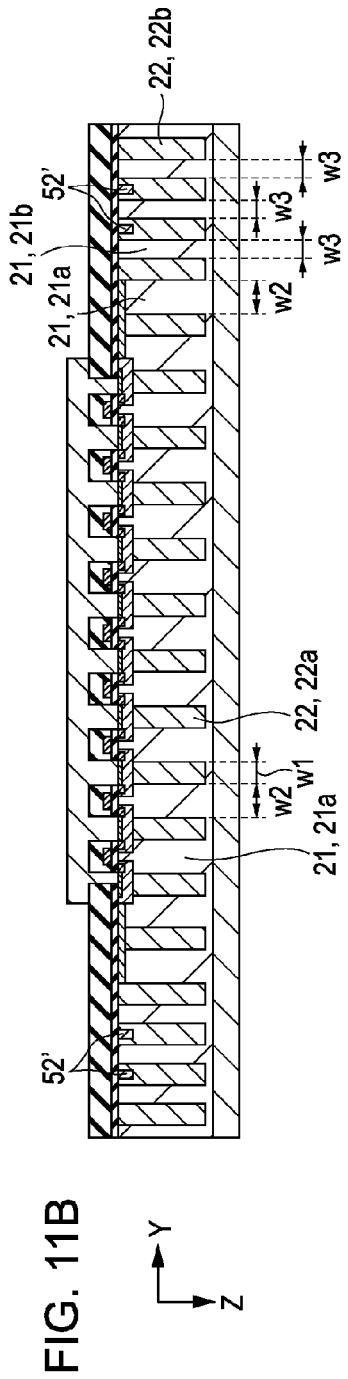
FIG. 11A
FIG. 11B

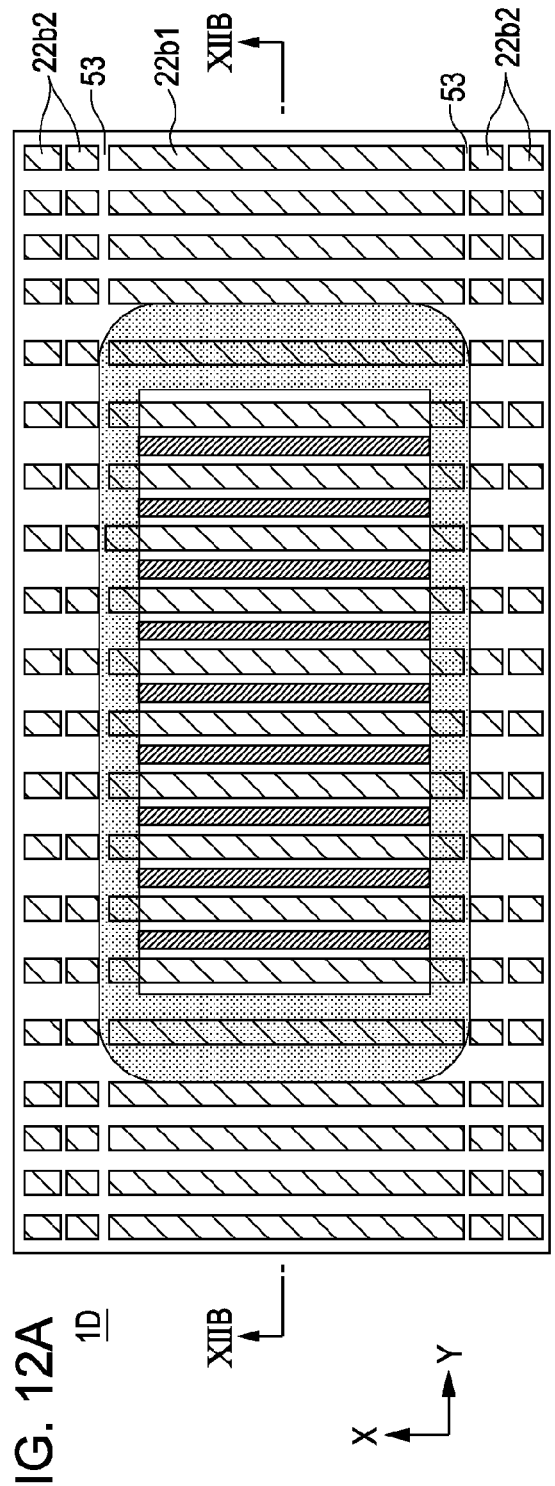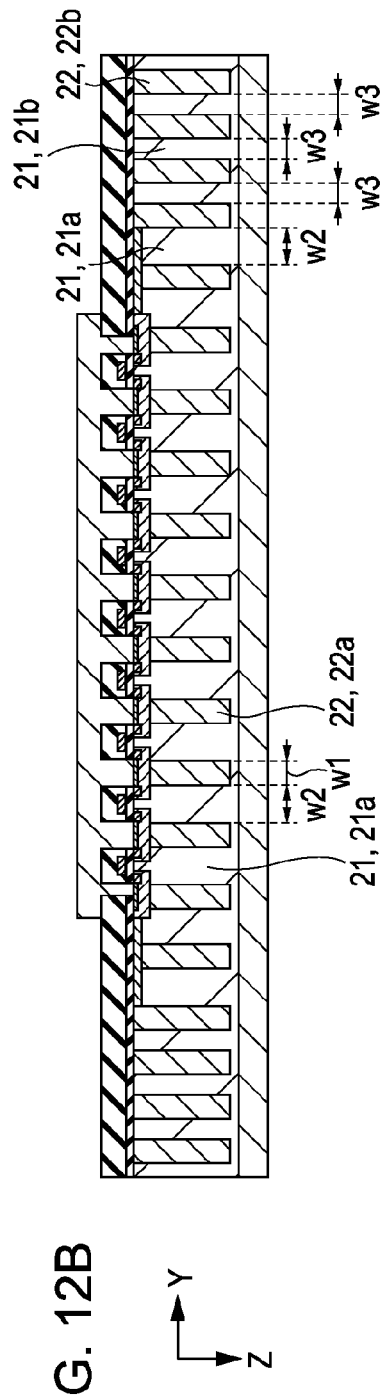

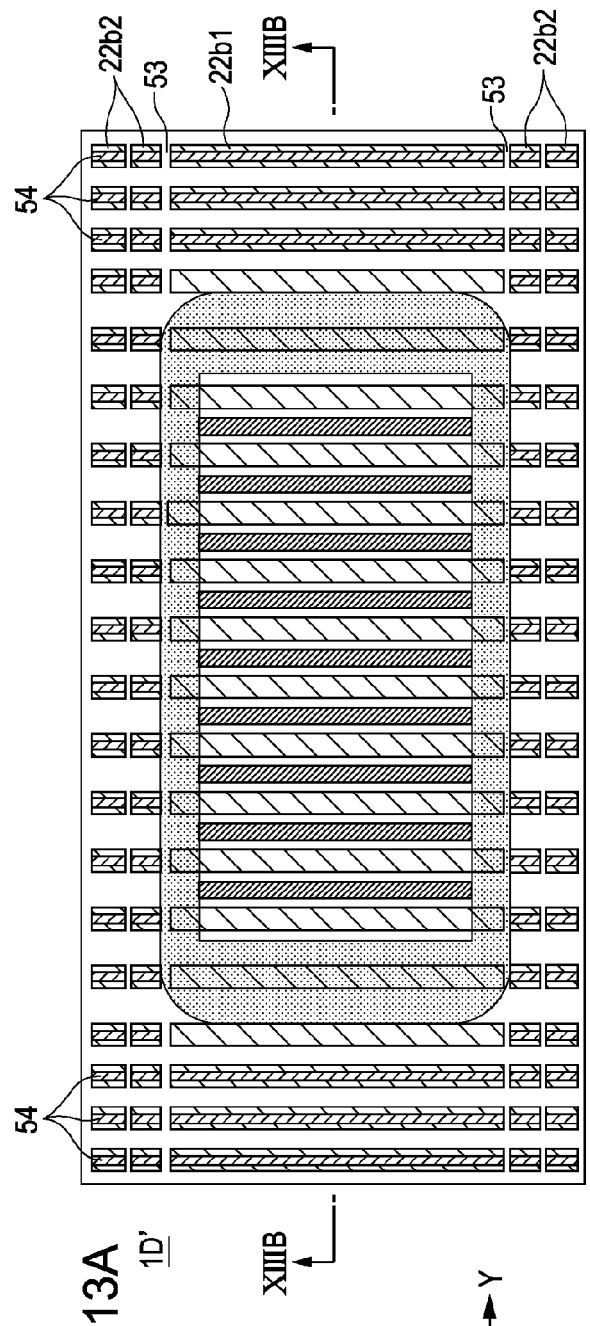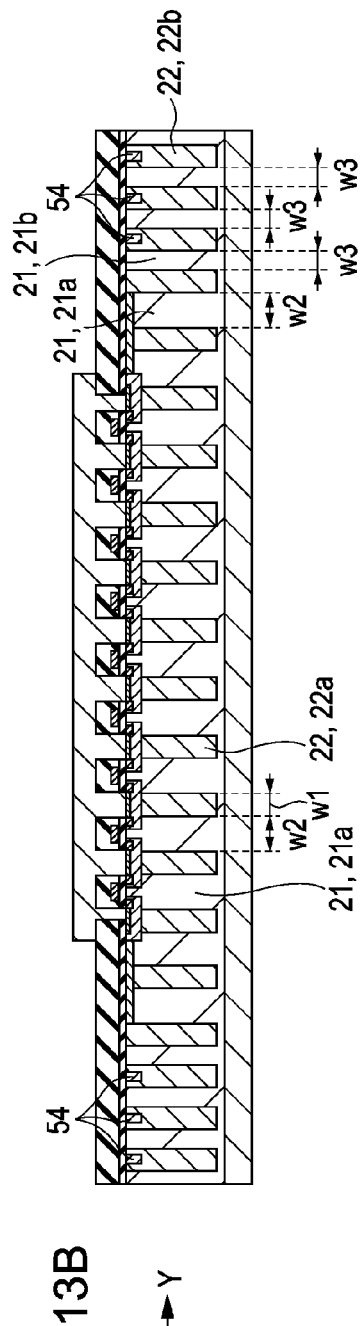
FIG. 13A
FIG. 13B

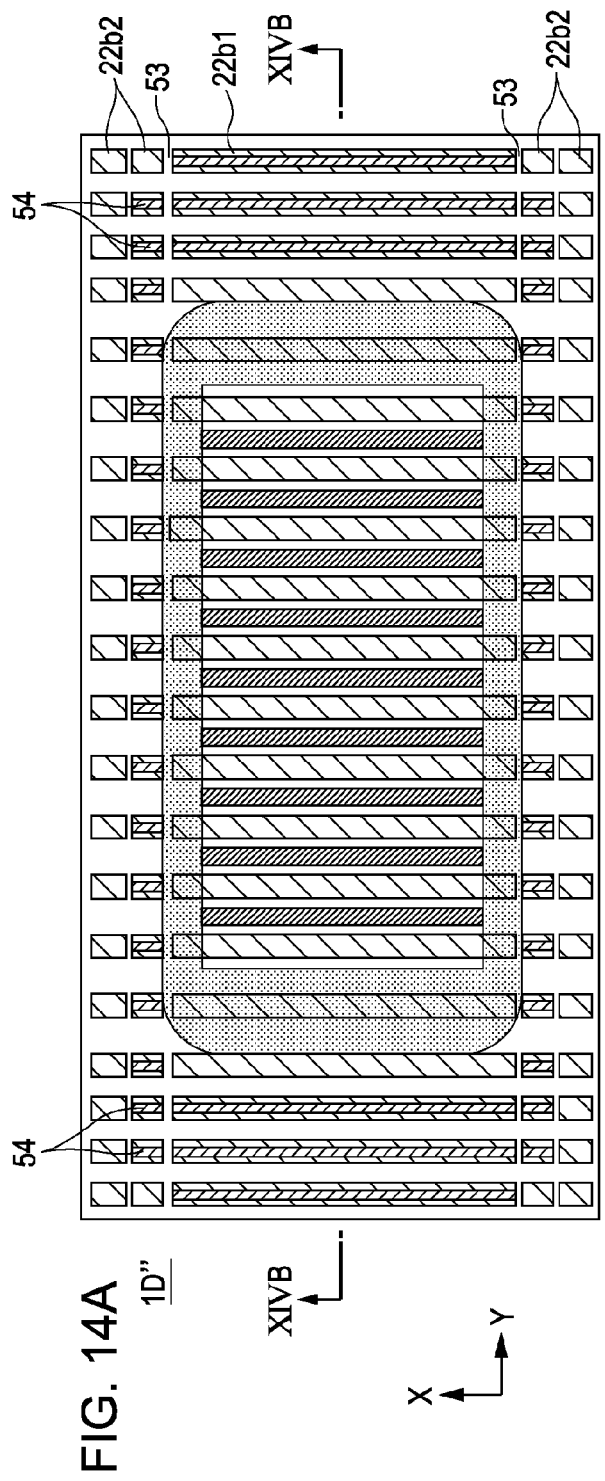
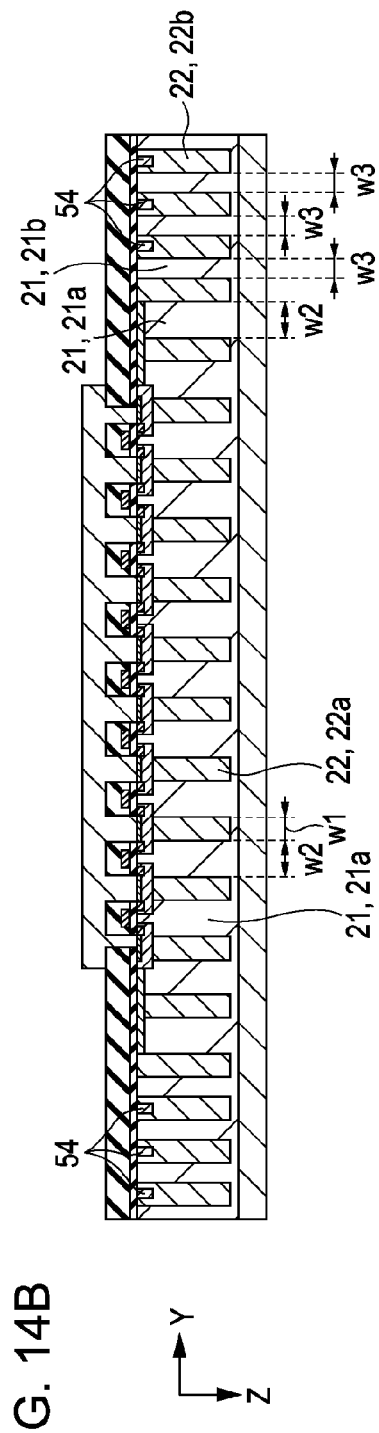
FIG. 14A
FIG. 14B

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same, and more particularly relates to a semiconductor device including a vertical semiconductor element which has a super junction structure and a method for manufacturing the same.

2. Description of the Related Art

In recent years, reduction in thickness and weight of electronic apparatuses, such as a liquid crystal television, a plasma television, and an organic electroluminescent television, has been strongly requested. Concomitant with this trend, reduction in size and improvement in performances of electric power devices embedded in electronic apparatuses have also been strongly requested.

Accordingly, in power semiconductor elements used as electric power apparatuses, in particular, in a vertical type metal oxide semiconductor field effect transistor (hereinafter referred to as "MOSFET"), an improvement in performances, such as an increase in withstand voltage, an increase in amount of current, a decrease in loss, an increase in speed, and an increase in fracture resistance, has been aggressively carried out.

The on-resistance and the withstand voltage of a vertical MOSFET strongly depend on an impurity concentration of an n-type semiconductor region which functions as a conductive layer of the MOSFET. In order to decrease the on-resistance, it is necessary to increase the impurity concentration of the n-type semiconductor region. However, in order to ensure a desired withstand voltage, it is not allowed to increase the impurity concentration of the n-type semiconductor region to a certain level or more.

The withstand voltage and the on-resistance have a trade-off relationship. As one method to overcome the relationship mentioned above, a vertical MOSFET having a super junction structure has been proposed in which p-type semiconductor regions and n-type semiconductor regions are arranged in a stripe or an island-shaped pattern in a region in which the withstand voltage has to be ensured (for example, see Japanese Unexamined Patent Application Publication No. 7-7154). In this vertical MOSFET (hereinafter referred to as "super junction vertical MOSFET"), a current is allowed to flow in the n-type semiconductor regions each functioning as a conductive layer in an ON state, and in an OFF state, the p-type semiconductor regions and the n-type semiconductor regions are completely depleted, so that the withstand voltage can be ensured.

SUMMARY OF THE INVENTION

As one method for manufacturing a super junction vertical MOSFET, a method for manufacturing an epitaxial-layer filled trench groove may be mentioned by way of example. In this method, first, an n-type semiconductor is formed on an n-type high concentration semiconductor substrate by an epitaxial process to have a thickness of several tens of micrometers, and trench grooves are then formed in this n-type semiconductor. Subsequently, a p-type semiconductor is grown to fill the trench grooves. As a result, a super junction structure is formed in which p-type semiconductors and n-type semiconductors each functioning as a p-type semiconductor pillar region and an n-type semiconductor pillar region, respectively, are alternately arranged side by side.

Since this method for manufacturing an epitaxial-layer filled trench groove is a simple process, has a small number of manufacturing steps, and includes no high-temperature long-time diffusion step, the widths and pitches of the n-type semiconductor pillar regions and the p-type semiconductor pillar regions can be decreased. Since the widths and the pitches can be decreased, the impurity concentration can be simultaneously increased. As a result, while a high withstand voltage is ensured, the on-resistance can be decreased.

However, in this method for manufacturing an epitaxial-layer filled trench groove, it is difficult to optionally and independently change and adjust the impurity concentration of the n-type semiconductor pillar region and that of the p-type semiconductor pillar region in an element region in which an MOSFET is formed and in a terminal region surrounding this element region. That is, a high withstand voltage has to be realized in both the terminal region and the element region at impurity concentrations equivalent to each other. Hence, in the terminal region, a high withstand voltage has to be realized by extending a depletion layer in a lateral direction while the impurity concentration of the p-type semiconductor pillar region and that of the n-type semiconductor pillar region are high.

Instead of the method for manufacturing an epitaxial-layer filled trench groove, by using a method for manufacturing a multi-epitaxial layer, the impurity concentration of the terminal region can be optionally adjusted. Hence, an increase in withstand voltage in the terminal region can be easily performed. In this method for manufacturing a multi-epitaxial layer, after an n-type semiconductor having a low impurity concentration is formed to have a thickness of several micrometers, a step of forming an n-type semiconductor super junction layer and a step of forming a p-type semiconductor super junction layer are repeated approximately 5 to 10 times by ion implantation using a resist mask, thereby forming a super junction vertical MOSFET.

According to this method for manufacturing a multi-epitaxial layer, an increase in withstand voltage in the terminal region can be easily realized. However, the process of this method is not simple as compared to that of a method for manufacturing an epitaxial-layer filled trench groove, and hence manufacturing is not easily performed at a low cost. Furthermore, since a high-temperature long-time diffusion step has to be performed, shrinkage and an increase in concentration of the super junction layer are difficult to realize.

Accordingly, it is desirable to provide a semiconductor device including a vertical semiconductor element which has a super junction structure capable of suitably realizing a high withstand voltage by a method for manufacturing an epitaxial-layer filled trench groove and a method for manufacturing the semiconductor device described above.

According to an embodiment of the present invention, there is provided semiconductor device which includes: a first conductive type semiconductor substrate; a first semiconductor region provided on an upper surface of the semiconductor substrate and including a region in which first conductive type first pillar regions and second conductive type second pillar regions, each having a long side in a first direction parallel to the upper surface of the semiconductor substrate, which are alternately arranged in a second direction which is parallel to the upper surface of the semiconductor substrate and which is orthogonal to the first direction; second conductive type second semiconductor regions provided on surfaces of second pillar regions in an element region in which a semiconductor element is formed so as to be in contact with first pillar regions in the element region; gate electrodes each provided on parts of adjacent second semiconductor regions and on one of the first pillar regions interposed therebetween with a gate insulating film provided under the gate electrodes; third semiconductor regions each functioning as a first conductive type source region provided in parts of the second semiconductor regions located under side portions of the gate electrodes; and a second conductive type resurf region which is a part of a terminal region surrounding the element region and which is provided on first pillar regions and second pillar regions in the part of the terminal region. In the semiconductor device described above, the widths of the second pillar regions provided from the element region to the terminal region are each set as a first width, the widths of the first pillar regions provided in the element region and the widths of the first pillar regions connected to the resurf region in the terminal region are each set as a second width, and the widths of first pillar regions which are provided in the terminal region and which are not provided with the resurf region thereon are each set smaller than the second width.

The semiconductor device described above further includes second conductive type semiconductors provided on surfaces of at least two second pillar regions which are continuously arranged in the second direction with respect to the second pillar regions connected to the resurf region with one of the first pillar regions provided therebetween, the at least two second pillar regions being among second pillar regions which are provided in the terminal region and which are not connected to the resurf region, the second conductive type semiconductors each having an impurity concentration higher than that of each of the at least two second pillar regions.

In the semiconductor device described above, the widths of the second conductive type semiconductors are each smaller than the width of each of the at least two second pillar regions provided thereunder.

In the semiconductor device described above, the second conductive type semiconductors are each provided so that two end positions thereof in the first direction approximately coincide with two end positions of the resurf region in the first direction.

In the semiconductor device described above, with respect to the at least two second pillar regions on which the second conductive type semiconductors are provided, at least one second pillar region continuously arranged in the second direction is provided with no second conductive type semiconductor thereon, the at least two second pillar regions and the at least one second pillar region being arranged with one of the first pillar regions provided therebetween.

In the semiconductor device described above, second pillar regions which are provided in the terminal region are each divided by a first conductive type semiconductor having a width smaller than the width of each of the first pillar regions in the element region into a first region having two end positions which approximately coincide with two end positions of the resurf region in the first direction and second regions located at two ends of the first region in the first direction.

In the semiconductor device described above, the first semiconductor region is a region formed by a process including the steps of forming a plurality of trench grooves in a first conductive type semiconductor layer provided on the upper surface of the semiconductor substrate to form the first pillar regions between the trench grooves and filling a second conductive type semiconductor in the trench grooves by an epitaxial growth to form the second pillar regions.

According to an embodiment of the present invention, there is provided a method for manufacturing a semiconductor device which includes the steps of: forming a first conductive type semiconductor layer on a first conductive type semiconductor substrate; forming trench grooves in the first conductive type semiconductor layer to form first conductive type first pillar regions between the trench grooves, the grooves each having a long side in a first direction parallel to an upper surface of the semiconductor substrate and being arranged in a second direction which is parallel to the upper surface of the semiconductor substrate and which is orthogonal to the first direction; filling a second conductive type semiconductor in the trench grooves by an epitaxial growth to form second conductive type second pillar regions; forming second conductive type second semiconductor regions on surfaces of second pillar regions in an element region in which a semiconductor element is formed so as to be in contact with first pillar regions in the element region; forming gate electrodes each provided on parts of adjacent second semiconductor regions and on one of the first pillar region interposed therebetween with a gate insulating film provided under the gate electrodes; forming third semiconductor regions each functioning as a first conductive type source region in parts of the second semiconductor regions located under side portions of the gate electrodes; and forming a second conductive type resurf region which is a part of a terminal region surrounding the element region on first pillar regions and second pillar regions in the part of the terminal region. In the manufacturing method described above, in the step of forming trench grooves, the widths of the second pillar regions formed from the element region to the terminal region are each set as a first width, the widths of the first pillar regions formed in the element region and the widths of the first pillar regions connected to the resurf region in the terminal region are each set as a second width, and the widths of first pillar regions which are formed in the terminal region and which are not provided with the resurf region thereon are set smaller than the second width.

According to an embodiment of the present invention, the structure can be provided in which in the terminal region of the semiconductor device having a super junction structure formed by a method for manufacturing an epitaxial-layer filled trench groove, the depletion layer can be more easily extended to the periphery of the element when the operation of the semiconductor element is placed in an OFF state and the generation of electric field concentration can be suppressed. As a result, in the terminal region, the charge balance can be obtained, and hence a stable semiconductor device having a high withstand voltage can be provided. Since the optimal terminal structure can be realized by a method for manufacturing an epitaxial-layer filled trench groove, the impurity concentration of the n-type semiconductor pillar region can be increased, and the on-resistance can be further decreased. Furthermore, since the manufacturing method is simple, manufacturing can be performed at a low cost.

BRIEF DESCRIPTION OF THE DRAWINGS

FIGS. 7A and 7B are views each illustrating the structure of a semiconductor device according to a second embodiment;

FIGS. 8A and 8B are views each illustrating the structure of another semiconductor device according to the second embodiment;

FIGS. 9A and 9B are views each illustrating the structure of a semiconductor device according to a third embodiment;

FIGS. 10A and 10B are views each illustrating the structure of another semiconductor device according to the third embodiment;

FIGS. 11A and 11B are views each illustrating the structure of another semiconductor device according to the third embodiment;

FIGS. 12A and 12B are views each illustrating the structure of a semiconductor device according to a fourth embodiment;

FIGS. 13A and 13B are views each illustrating the structure of another semiconductor device according to the fourth embodiment; and FIGS. 14A and 14B are views each illustrating the structure of another semiconductor device according to the fourth embodiment.

DESCRIPTION OF THE PREFERRED EMBODIMENTS

Hereinafter, a semiconductor device including a super junction vertical MOSFET (hereinafter simply referred to as "semiconductor device") according to an embodiment of the present invention will be described in detail with reference to the accompanying drawings.

<First Embodiment>

(Structure of Semiconductor Device 1A)

Figure 1:
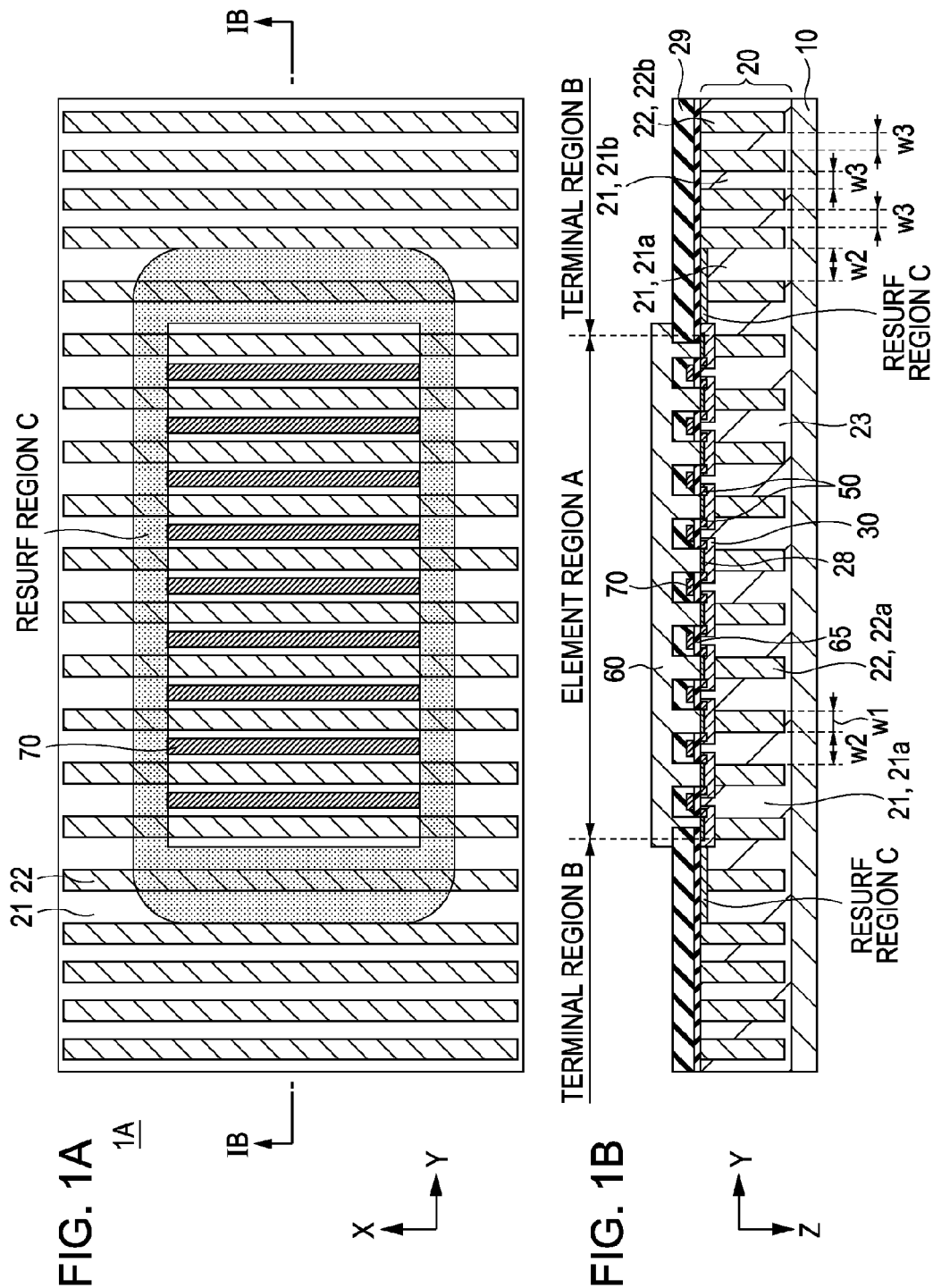
FIGS. 1A and 1B are views each illustrating the structure of a semiconductor device according to a first embodiment.

FIGS. 1A and 1B are views each illustrating the structure of a semiconductor device 1A according to a first embodiment. FIG. 1A is a schematic XY plan view showing the structure of the semiconductor device 1A, and FIG. 1B is a YZ cross-sectional view taken along the line IB-IB of FIG. 1A. Since the structure is shown by the schematic views, the dimensions are not limited to those shown in the figures, and the same thing can also be applied to the other embodiments. In FIG. 1A, in order to facilitate the understanding of the arrangement of n-type semiconductor pillar regions 21, p-type semiconductor pillar regions 22, gate electrodes 70, and a resurf region C, which will be described later, some constituent elements are not shown in the figure.

The semiconductor device 1A according to the first embodiment includes an n-type high concentration substrate 10 ($n^+$-type drain layer) which is one example of a first conductive type semiconductor substrate having a relatively high impurity concentration. As this n-type high concentration substrate 10, for example, an n-type semiconductor, such as Si, containing phosphorus (P), arsenic (As) or antimony (Sb) as an n-type impurity at a concentration of $1\times10^{18}$ to $5\times10^{19}/cm^3$ may be mentioned. On a surface of the n-type high concentration substrate 10, a first semiconductor region 20 including an n-type epitaxial layer 23 having an impurity concentration lower than that of this n-type high concentration substrate 10 is formed. This first semiconductor region 20 is formed, for example, of an n-type semiconductor, such as Si, containing P at a concentration of $2\times10^{15}$ to $2\times10^{16}/cm^3$.

In this first semiconductor region 20, the n-type semiconductor regions 21 (hereinafter referred to as "n-type semiconductor pillar regions 21") and the p-type semiconductor regions 22 (hereinafter referred to as "p-type semiconductor pillar regions 22") are alternately arranged to form a super junction region. The n-type semiconductor pillar region 21 is a region provided between adjacent p-type semiconductor pillar regions 22 in the n-type epitaxial layer 23.

The n-type semiconductor pillar regions 21 and the p-type semiconductor pillar regions 22 are each formed to have a pillar shape having a long side in an X direction (first direction) parallel to an upper surface of the n-type high concentration substrate 10. In addition, the n-type semiconductor pillar regions 21 and the p-type semiconductor pillar regions 22 are alternately arranged in a stripe pattern in a Y direction (second direction) parallel to the upper surface of the n-type high concentration substrate 10 and orthogonal to the X direction.

The n-type semiconductor pillar regions 21 and the p-type semiconductor pillar regions 22 are formed such that after trench grooves each having a long side in the X direction are formed in the n-type epitaxial layer 23 in the Y direction with intervals therebetween, a p-type semiconductor is filled in the trench grooves, for example, by an epitaxial growth of Si together with boron (B) as an impurity. This manufacturing method will be described later in detail.

The n-type semiconductor pillar region 21 is formed by an epitaxial growth of an n-type semiconductor, such as Si, containing P as an n-type impurity at an impurity concentration of $2\times10^{15}$ to $2\times10^{16}/cm^3$. In addition, the p-type semiconductor pillar region 22 is formed by an epitaxial growth of a p-type semiconductor, such as Si, containing B as a p-type impurity at an impurity concentration of $2\times10^{15}$ to $2\times10^{16}/cm^3$. The width of the n-type semiconductor pillar region 21 in a short side direction (Y direction) is, for example, 2 to 5 μm. In addition, the width of the p-type semiconductor pillar region 22 in a short side direction (Y direction) is, for example, 2 to 5 μm, and the aspect ratio (long side direction/short side direction) is, for example, 10 to 20.

The n-type semiconductor pillar regions 21 and the p-type semiconductor pillar regions 22 are formed from an element region (element active region) A in which a MOSFET is formed to a terminal region B surrounding this element region A. The p-type semiconductor pillar region 22 functions as a p-type drift layer. In addition, the n-type semiconductor pillar region 21 functions as an $n^-$-type drift layer.

On surfaces of p-type semiconductor pillar regions 22 in the element region A, p-type semiconductor regions 30 are formed to be in contact with adjacent n-type semiconductor pillar regions 21 in the element region A. This p-type semiconductor region 30 is formed, for example, of a p-type semiconductor of Si containing B as a p-type impurity at an impurity concentration of $1 \times 10^{17}$ to $4 \times 10^{17}/\text{cm}^3$.

Source regions 50 each composed of an n-type semiconductor are formed in parts of surfaces of the p-type semiconductor regions 30, and a source electrode 60 composed of a metal layer is formed on the surfaces of the p-type semiconductor regions 30. The source region 50 is formed of an n-type semiconductor, such as Si, containing P or As as an n-type impurity at an impurity concentration, for example, of $1 \times 10^{19}/\text{cm}^3$ or more.

In addition, gate electrodes 70 are each formed on parts of adjacent p-type semiconductor regions 30 and an n-type semiconductor pillar region 21 interposed therebetween with a gate insulating film 65 provided under the gate electrodes 70. The source regions 50 are formed in parts of the surfaces of the p-type semiconductor regions 30 located under side portions of the gate electrodes 70.

In this semiconductor device 1A, a drain electrode (not shown) located at a lower surface side of the n-type high concentration substrate 10 functions as a high voltage electrode, and the source electrode 60 formed at an opposite side to the n-type high concentration substrate 10 functions as a low voltage electrode and is generally used at a ground voltage.

In the semiconductor device 1A of this embodiment, as described above, the super junction region composed of the n-type semiconductor pillar regions 21 and the p-type semiconductor pillar regions 22 is not only formed in the element region A but also formed in the terminal region B which is located along the periphery of the element region A. In addition, an interlayer insulating film 29 is formed on a surface of this terminal region B, and at a peripheral end of the terminal region B, a field stopper (not shown) is formed.

Furthermore, in this semiconductor device 1A, a p⁻-type reduced surface field (resurf) region C is formed on a part of the super junction region in this terminal region B so as to be adjacent to the periphery of the element region A. This resurf region C is a part of the terminal region B surrounding the element region A and is formed on n-type semiconductor pillar regions 21 and p-type semiconductor pillar regions 22 in the part of the terminal region B. This resurf region C is formed of a p-type semiconductor, such as Si, containing B as a p-type impurity at an impurity concentration of $1 \times 10^{16}$ to $3 \times 10^{17}/\text{cm}^3$.

When the MOSFET is in a non-conduction state, this resurf region C has a function to extend a depletion layer in right and left directions (Y direction shown in FIG. 1) of the terminal region B to suppress electric field concentration in the terminal region B.

Figure 2:
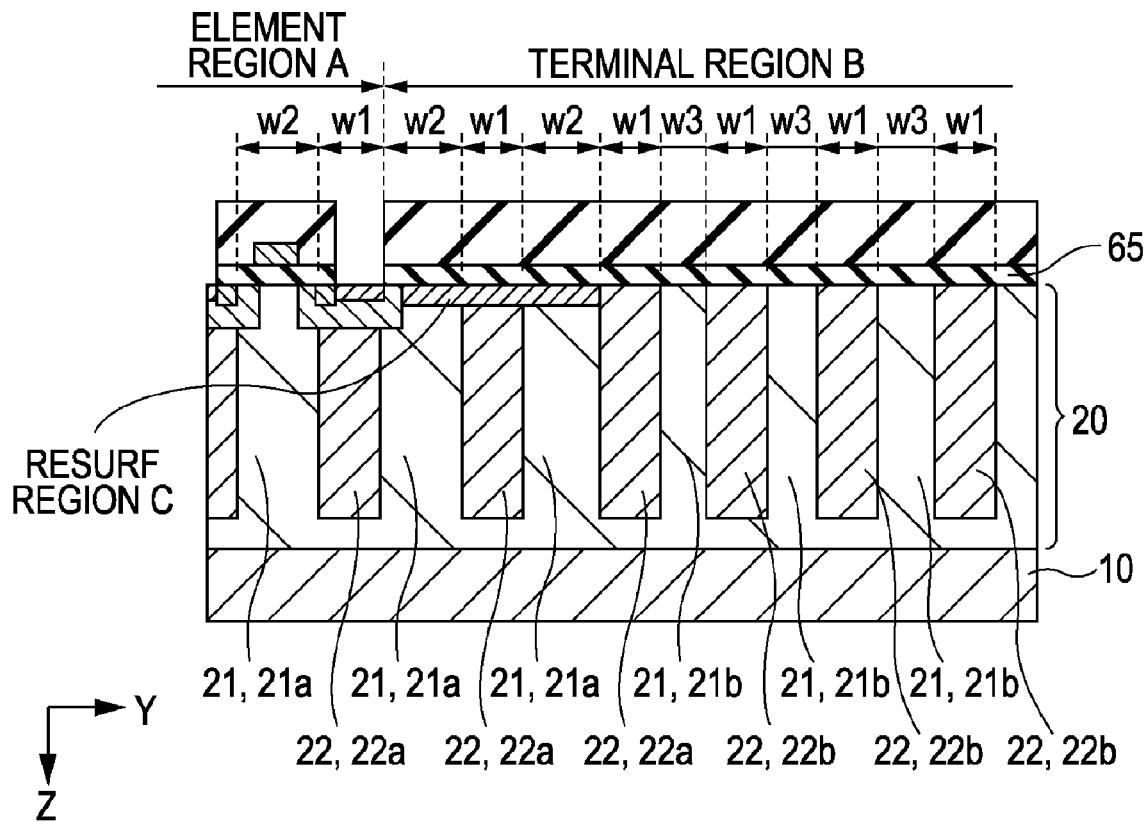
FIG. 2 is a view illustrating the structure of the semiconductor device according to the first embodiment.

As described above, in the semiconductor device 1A of this embodiment, the super junction region including the n-type semiconductor pillar regions 21 and the p-type semiconductor pillar regions 22 is formed from the element region A to the terminal region B including the resurf region C, and the following structure has particular features. With reference to FIG. 2 which is a partially enlarged view of FIG. 1B, the structure will be described.

First, the width of each p-type semiconductor pillar region 22, in other words, the width of each trench groove, is set as a uniform first width w1 from the element region A to the terminal region B. In addition, this first width w1 is not necessary to be uniform in a strict sense and may have an error of approximately ±5%.

As described above, since the widths of the p-type semiconductor pillar regions 22 are set uniform, when a p-type semiconductor is filled in the trench grooves by an epitaxial growth, filling can be uniformly performed in a wafer surface.

On the other hand, the width of each n-type semiconductor pillar region 21 inside the resurf region C is different from that outside the resurf region C. That is, the width of each n-type semiconductor pillar region 21a in the element region A is set as a second width w2, and as in the case described above, among n-type semiconductor pillar regions 21 in the terminal region B, the width of each n-type semiconductor pillar region 21a connected to the resurf region C is also set as the second width w2.

Furthermore, among the n-type semiconductor pillar regions 21 in the terminal region B, the width of each n-type semiconductor pillar region 21b which is not connected to the resurf region C is set as a third width w3 smaller than the second width w2. In addition, in the semiconductor device 1A of this embodiment, although the width of each n-type semiconductor pillar region 21b is set as a uniform width w3, the width w3 is not necessary to be uniform as long as it is smaller than the second width w2. For example, an n-type semiconductor pillar region having a third width w3 and an n-type semiconductor pillar region having a width smaller than the third width w3 may be alternately and repeatedly arranged in a direction apart from the element region A along the Y direction. Alternatively, the widths of the n-type semiconductor pillar regions 21b may be gradually decreased in a direction apart from the element region A along the Y direction. This structure may also be applied to the other embodiments.

Since the width of each n-type semiconductor pillar region 21b is set smaller than the second width w2, by applying a voltage to the drain electrode when the MOSFET is in an OFF state, that is, when the source electrode is at a ground potential, the super junction region in the element region A and that in the terminal region B are both depleted. Hence, the depletion layer can be easily extended outside further from the resurf region C.

As a result, the electric field in the super junction region is uniformed, and the generation of points of electric field concentration can be suppressed, so that the withstand voltage of the MOSFET can be improved. Furthermore, a super junction vertical MOSFET which suppresses fluctuations caused by manufacturing variations can be provided.

(Mechanism of Improvement in Withstand Voltage)

Hereinafter, the mechanism will be described in which when an MOSFET is in an OFF state, the withstand voltage is improved by the structure described above. First, a phenomenon in a long side direction (X direction) and a depth direction (Z direction) of the p-type semiconductor pillar region 22 will be described.

When a voltage is applied to the n-type high concentration substrate 10 connected to the drain electrode, the p-type semiconductor pillar region 22 connected to the source electrode 60 in the element region A is depleted. In this stage, in the region in which depletion occurs, the potential changes in accordance with the distance from the source electrode 60.

For example, when the source electrode 60 is at a ground potential, and the drain electrode is at 600 V, a region immediately under the source electrode 60 and that in the vicinity thereof are at a ground potential which is the same as that of the source electrode 60. However, in a long side direction (X direction) and a direction to the n-type high concentration substrate 10 (Z direction), the potential changes in accordance with the distance from the source electrode 60.

In addition, in a short side direction (Y direction) of the p-type semiconductor pillar region 22, the following phenomenon occurs.

When a voltage is applied to the drain electrode, in the element region A, a p-type semiconductor pillar region 22a electrically connected to the source electrode 60 is depleted. In addition, as in the case described above, a p-type semiconductor pillar region 22a connected to the resurf region C is also depleted when a voltage is applied to the drain electrode. In addition, as described above, the potential thereof changes in accordance with the length (distance) of the depletion layer from the source electrode 60 to the drain electrode.

On the other hand, in p-type semiconductor pillar regions 22b which are not electrically connected to the resurf region C, when the depletion layer reaches a p-type semiconductor pillar region 22b next to the resurf region C, the potential is first transmitted. That is, when no depletion layer reaches the p-type semiconductor pillar region 22b, the potential from the source electrode 60 is not transmitted.

Figure 3:
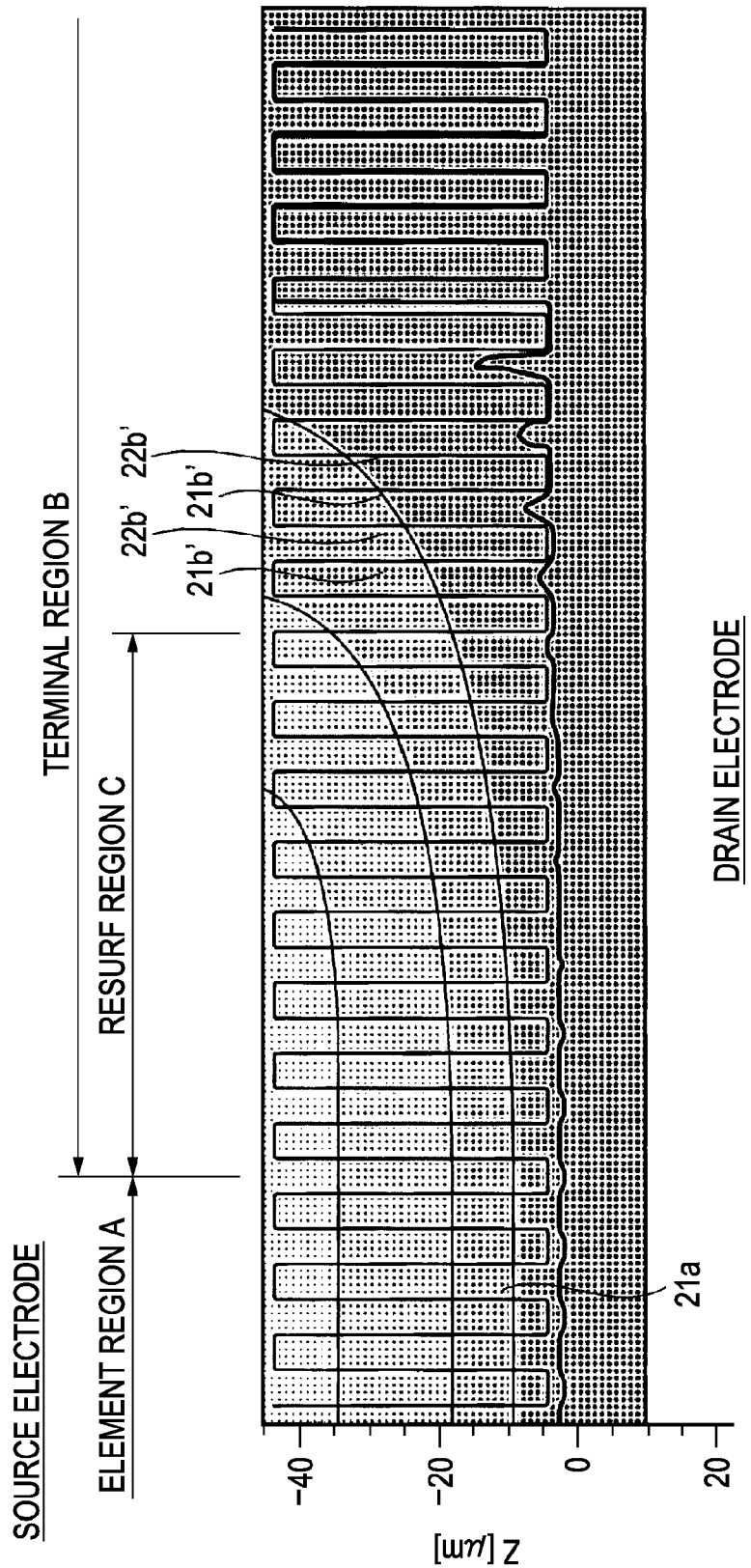
FIG. 3 is a view showing a potential distribution in a YZ plane of a semiconductor device prepared for comparison purpose.

In FIG. 3, a potential distribution in a YZ plane of a semiconductor device prepared for comparison purpose is shown. This semiconductor device prepared for comparison purpose is a semiconductor device in which the width of an n-type semiconductor pillar region 21b' which is not connected to the resurf region C in the terminal region B is set equal to the width of the n-type semiconductor pillar region 21a in the element region A, that is, to the second width w2.

As shown in FIG. 3, in the terminal region B except the resurf region C, p-type semiconductor pillar regions 22b' which are not depleted are present. These p-type semiconductor pillar regions 22b' are at a potential approximately equivalent to that of the drain electrode.

Accordingly, in the semiconductor device 1A, among the n-type semiconductor pillar regions 21 in the terminal region B, the width of each n-type semiconductor pillar region 21b which is not connected to the resurf region C is set smaller than the width of each n-type semiconductor pillar region 21a in the element region A and the width of each n-type semiconductor pillar region 21a connected to the resurf region C in the terminal region B. As a result, the p-type semiconductor pillar region 22b can be more easily depleted.

In addition, when the widths of some n-type semiconductor pillar regions 21b in the terminal region B are decreased, the size of the terminal region B can be efficiently reduced, and hence the chip size can also be reduced.

Figure 4:
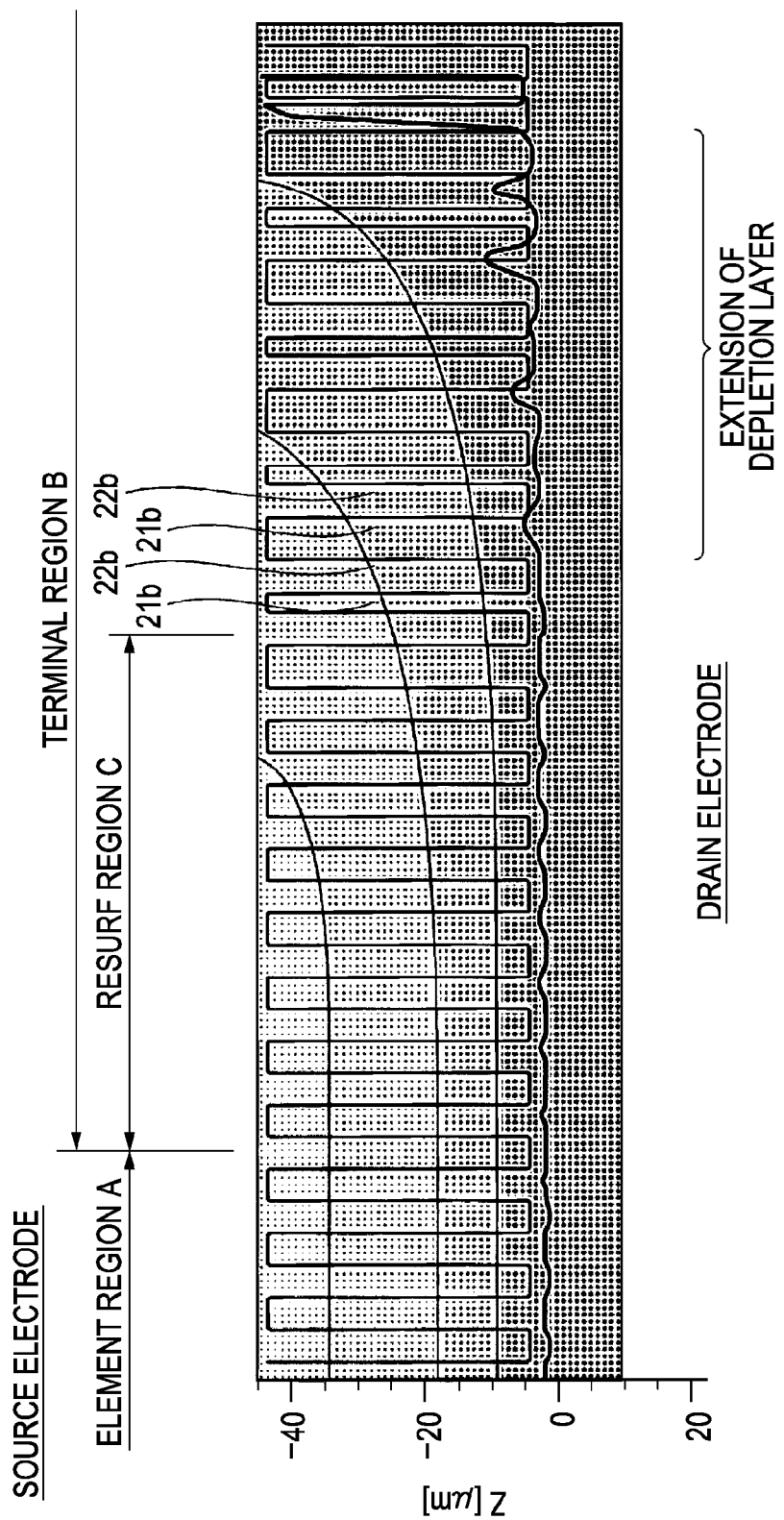
FIG. 4 is a view showing a potential distribution in a YZ plane of the semiconductor device according to the first embodiment.

In FIG. 4, a potential distribution in a YZ plane of the semiconductor device 1A having the terminal region B as described above is shown. As shown in FIG. 4, when the MOSFET is in an OFF state, the depletion layer can be more easily extended to the periphery of the MOSFET, and hence the concentration of electric field can be suppressed.

Figure 5:
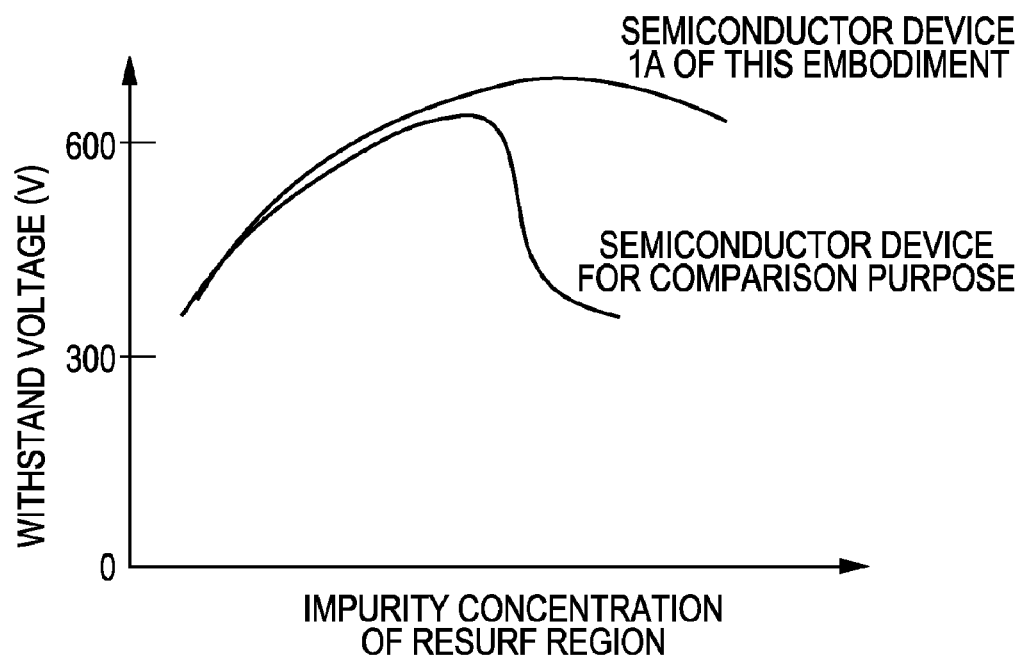
FIG. 5 is a graph showing the relationship between the withstand voltage and the impurity concentration of a resurf region.

In addition, in FIG. 5, the relationship between the withstand voltage and the impurity concentration of the resurf region C of the semiconductor device 1A of this embodiment and that of the semiconductor device prepared for comparison purpose are shown. As shown in FIG. 5, in the semiconductor device 1A of this embodiment, compared to the semiconductor device prepared for comparison purpose, the impurity concentration of the resurf region C can be increased while the withstand voltage is maintained. Hence, in the semiconductor device 1A, compared to the semiconductor device prepared for comparison purpose, the on-resistance can be further decreased.

(Method for Manufacturing Semiconductor Device 1A)

Next, a method for manufacturing the semiconductor device 1A of this embodiment will be described in detail with reference to the accompanying drawings.

Figure 6A:
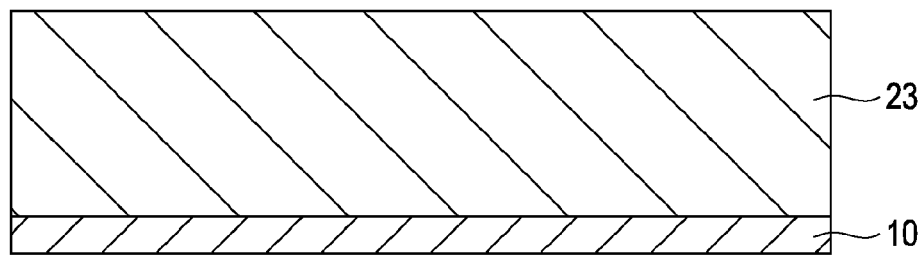
FIG. 6A is a view illustrating a step of manufacturing the semiconductor device according to the first embodiment.

First, as shown in FIG. 6A, for example, an n-type semiconductor substrate, such as Si, containing P, As, or Sb as an n-type impurity at a concentration $1 \times 10^{19}/cm^3$ or more is prepared as the n-type high concentration substrate 10. Subsequently, for example, an n-type semiconductor, such as Si, containing P as an n-type impurity at an impurity concentration of $2 \times 10^{15}$ to $2 \times 10^{16}/cm^3$ is grown on the n-type high concentration substrate 10 to form an n-type epitaxial layer 23 having a thickness of 40 to 60 μm.

Figure 6B:
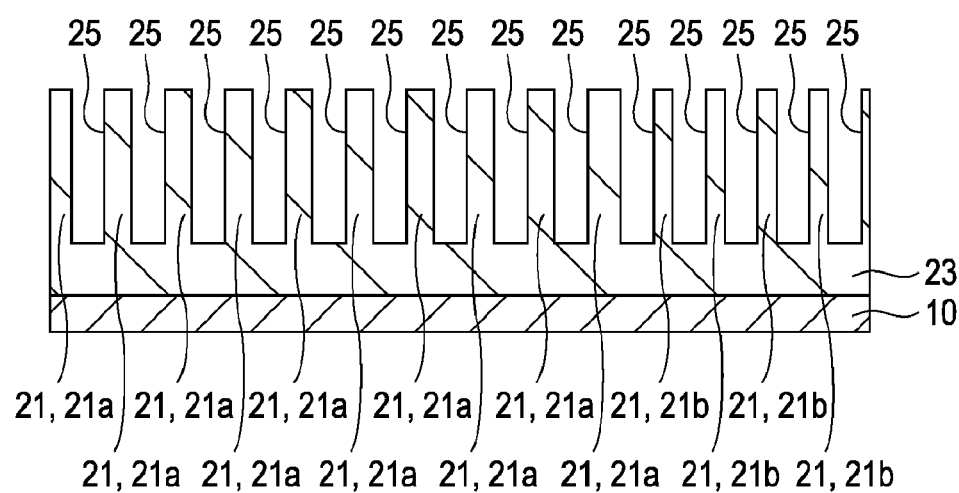
FIG. 6B is a view illustrating a step of manufacturing the semiconductor device according to the first embodiment.

Next, as shown in FIG. 6B, by an etching method using a resist mask (not shown) having a stripe pattern to form the p-type semiconductor pillar regions 22, the trench grooves 25 are formed in the n-type epitaxial layer 23 to have a depth of 35 to 55 μm. The trench grooves 25 are formed, for example, to have a width of 2 to 5 μm with pitches of 4 to 12 μm. In addition, in the terminal region B other than the resurf region C, the pitch between the trench grooves 25 is made different from that in the element region A and the resurf region C. As a result, the n-type semiconductor pillar regions 21b can be formed as described above.

In addition, as a method for forming the trench grooves 25, after a hard mask, such as a silicon oxide ($SiO_2$) film, is formed on the n-type epitaxial layer 23, dry etching may be performed, or a BOSCH process may be applied while a resist mask is used.

Figure 6C:
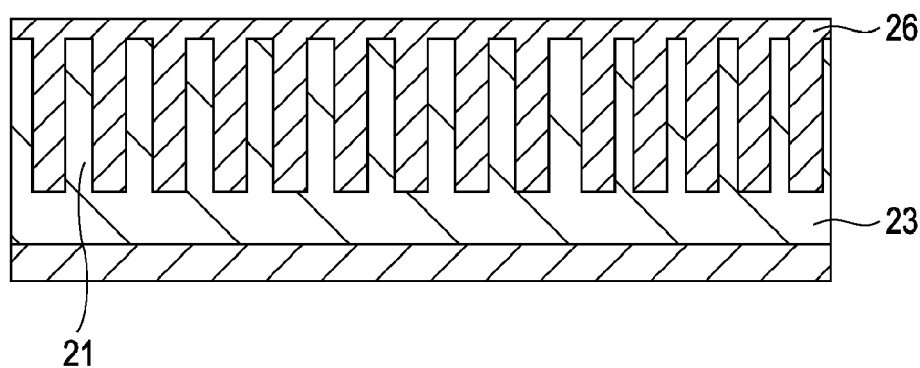
FIG. 6C is a view illustrating a step of manufacturing the semiconductor device according to the first embodiment.

Next, after the resist mask on a surface of the n-type epitaxial layer 23 in which the trench grooves 25 are formed is removed, as shown in FIG. 6C, for example, Si or the like is epitaxially grown together with B inside the trench grooves 25, so that a p-type semiconductor 26 is formed therein. The impurity concentration of this p-type semiconductor 26 is, for example, $2 \times 10^{15}$ to $2 \times 10^{16}/cm^3$.

Figure 6D:
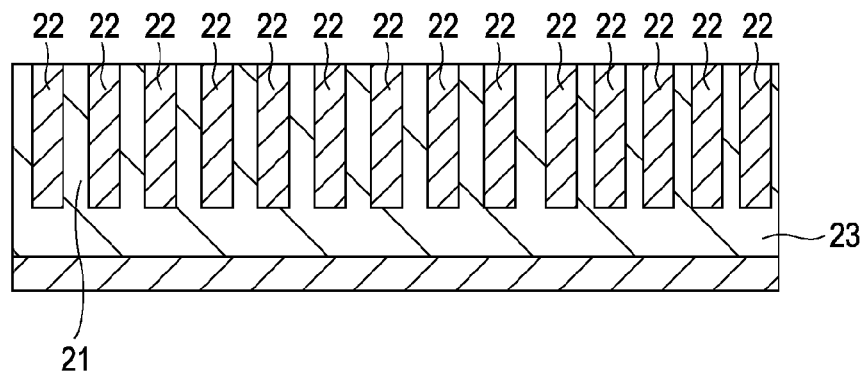
FIG. 6D is a view illustrating a step of manufacturing the semiconductor device according to the first embodiment.

Next, as shown in FIG. 6D, a surface of the p-type semiconductor 26 is polished by a chemical mechanical polishing (CMP) method to perform a mirror finishing treatment. In this step, the surface of the n-type epitaxial layer 23 is partially exposed. As a result, a super junction structure composed of the n-type semiconductor pillar regions 21 and the p-type semiconductor pillar regions 22 is formed.

Figure 6E:
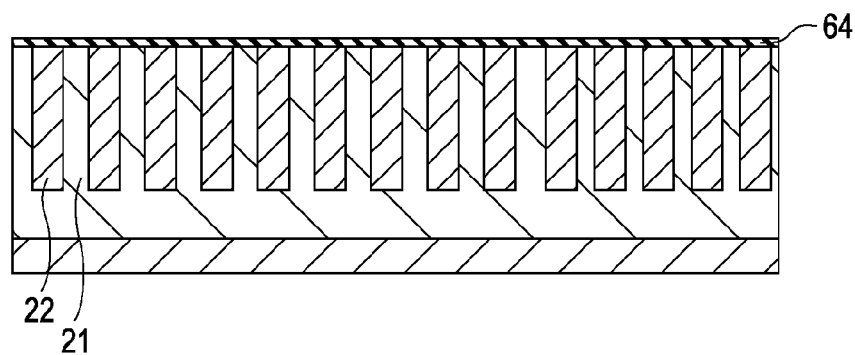
FIG. 6E is a view illustrating a step of manufacturing the semiconductor device according to the first embodiment.

Next, as shown in FIG. 6E, an insulating film 64 is formed on the n-type semiconductor pillar regions 21 and the p-type semiconductor pillar regions 22. This insulating film 64 functions as the gate insulating film 65 and is formed, for example, of a silicon oxide ($SiO_2$) film.

Figure 6F:
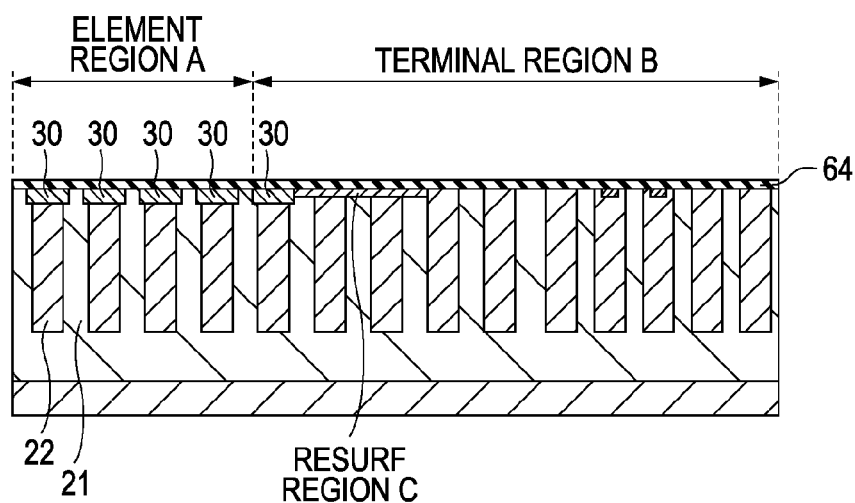
FIG. 6F is a view illustrating a step of manufacturing the semiconductor device according to the first embodiment.

Subsequently, a resist mask (not shown) is selectively formed on the insulating film 64 by a photolithographic technique. Next, by ion implantation of B using this resist mask, as shown in FIG. 6F, the p-type semiconductor regions 30 are formed on the p-type semiconductor pillar regions 22 in the element region A, and the resurf region C is further formed. This p-type semiconductor region 30 is formed of a p-type semiconductor, such as Si, containing B at an impurity concentration of $1 \times 10^{17}$ to $4 \times 10^{17}/cm^3$. In addition, this resurf region C is formed of a p-type semiconductor, such as Si, containing B at an impurity concentration of $1 \times 10^{16}$ to $3 \times 10^{17}/cm^3$ and is formed on the n-type semiconductor pillar regions 21 and the p-type semiconductor pillar regions 22 in a region which is a part of the terminal region B to surround the element region A.

Figure 6G:
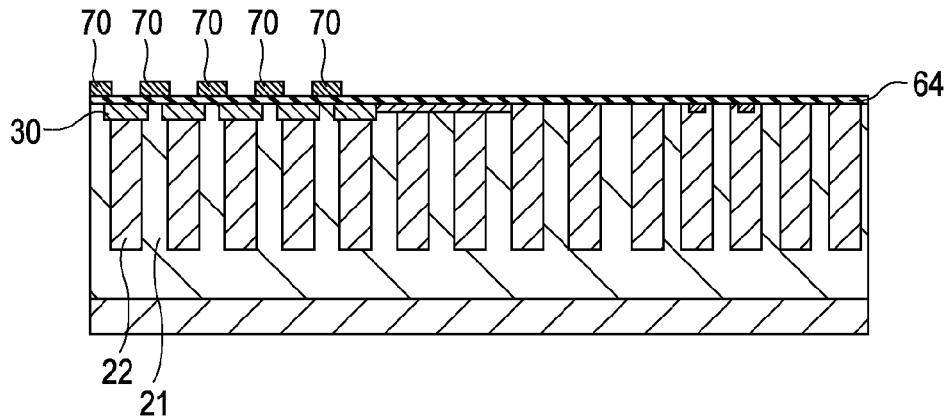
FIG. 6G is a view illustrating a step of manufacturing the semiconductor device according to the first embodiment.

Next, a metal layer composed of Cu (copper) is formed on the insulating film 64 by a chemical vapor deposition (CVD) method and is then selectively and partially removed by a photolithographic technique and an etching technique. As a result, as shown in FIG. 6G, the gate electrodes 70 are each formed on parts of adjacent p-type semiconductor regions 30 and one n-type semiconductor pillar region 21 provided therebetween.

In addition, although the metal layer is formed using Cu in this embodiment, the metal is not limited thereto and, for example, the metal layer may be formed using aluminum (Al) or titanium (Ti), or a multilayer structure in which the metal materials mentioned above are laminated may be used as the metal layer.

Figure 6H:
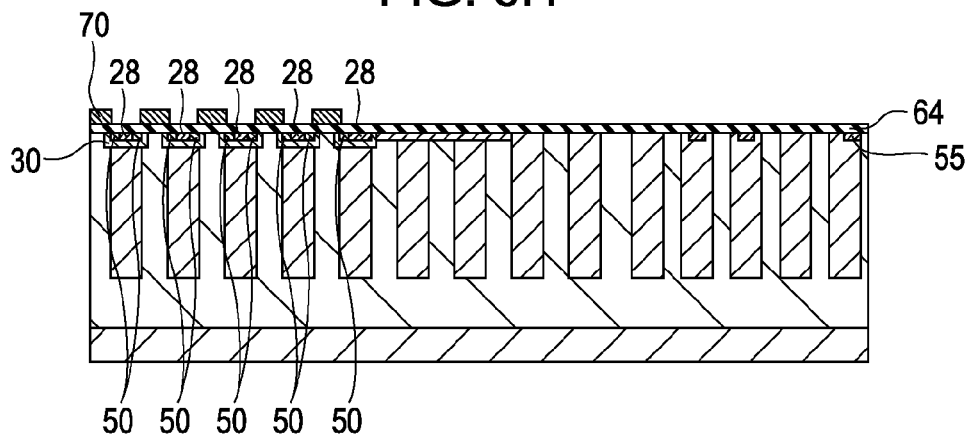
FIG. 6H is a view illustrating a step of manufacturing the semiconductor device according to the first embodiment.

In addition, as shown in FIG. 6H, B is selectively ion-implanted as a p-type impurity into parts of the surfaces of the p-type semiconductor regions 30 and part of a surface of the resurf region C to form $p^+$-type semiconductor regions 28. Furthermore, an n-type impurity is selectively ion-implanted in parts of surfaces of the $p^+$-type semiconductor regions 28 and in an end portion of the terminal region B. As a result, source regions 50 are formed in parts of the surfaces of the p-type semiconductor regions 30, and in a part of a surface of the p-type semiconductor pillar region 22 in the terminal region B or in an end portion of a surface of the n-type semiconductor pillar region 21b, a channel stopper 55 is formed. However, the channel stopper 55 may also be formed by a different step.

Figure 6I:
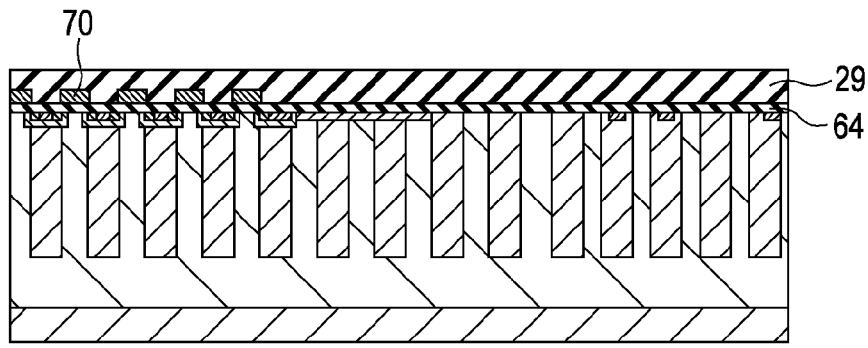
FIG. 6I is a view illustrating a step of manufacturing the semiconductor device according to the first embodiment.
Figure 6J:
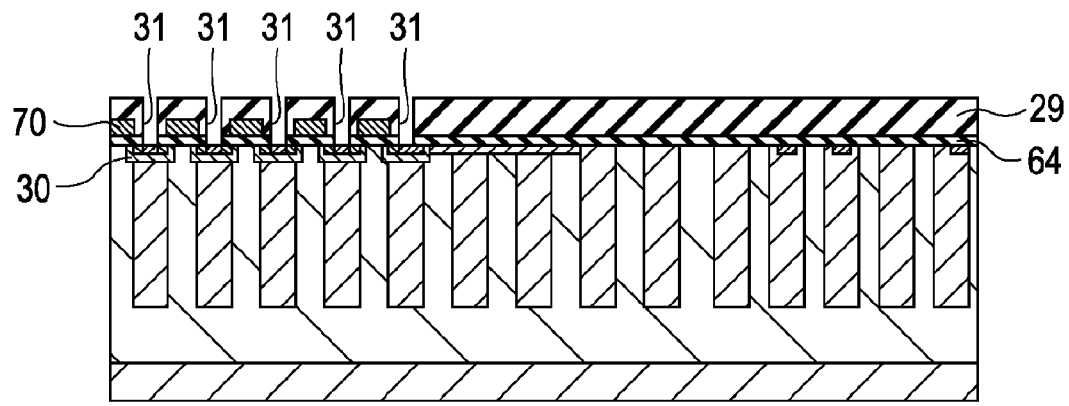
FIG. 6J is a view illustrating a step of manufacturing the semiconductor device according to the first embodiment.

Next, as shown in FIG. 6I, an interlayer insulating film 29 composed of $SiO_2$ is formed on the insulating film 64 including the gate electrodes 70 by a CVD method or the like. Subsequently, as shown in FIG. 6J, by using a photolithographic technique and an etching technique, the interlayer insulating film 29 and the insulating film 64 on the p-type semiconductor regions 30 in the element region A are selectively removed. As a result, contact holes 31 for the source electrode 60 are formed.

Figure 6K:
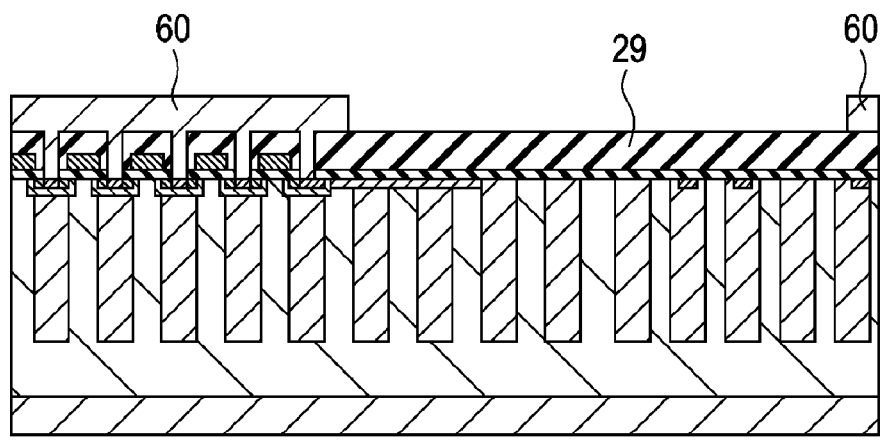
FIG. 6K is a view illustrating a step of manufacturing the semiconductor device according to the first embodiment.

Subsequently, as shown in FIG. 6K, the source electrode 60 is selectively formed, for example, by a CVD method and an etching technique using a metal layer of Cu or an aluminum-based alloy, such as Al—Cu, in a region including the contact holes 31. In addition, although the source electrode 60 is also formed using Cu, as in the gate electrode 70 described above, for example, aluminum (Al) or titanium (Ti) may also be used. Although not being shown in the figure, in this step, a metal layer to be formed into gate wires is simultaneously formed.

Figure 6L:
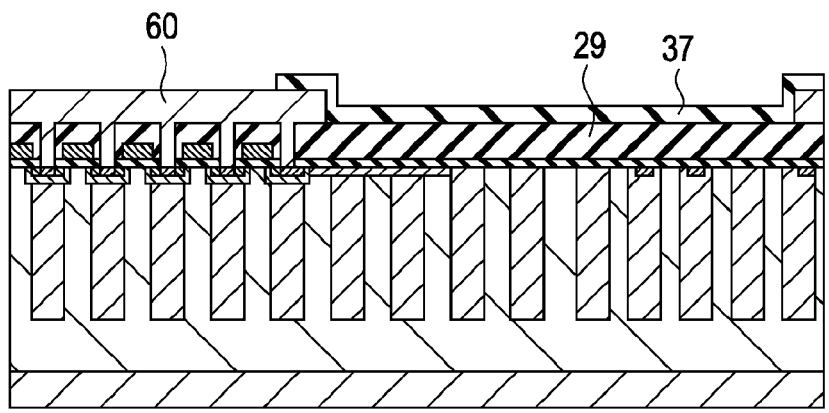
FIG. 6L is a view illustrating a step of manufacturing the semiconductor device according to the first embodiment.
Figure 6M:
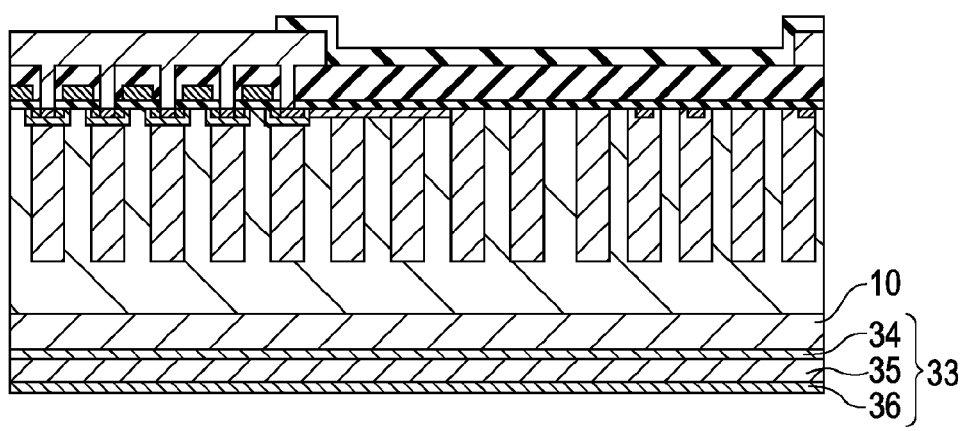
FIG. 6M is a view illustrating a step of manufacturing the semiconductor device according to the first embodiment.

Next, as shown in FIG. 6L, a protective film 37 composed, for example, of silicon nitride (SiN) is selectively formed on the interlayer insulating film 29 and on part of the source electrode 60. In addition, as shown in FIG. 6M, a bottom surface of the n-type high concentration substrate 10 is polished so that the thickness thereof is decreased to 100 to 200 μm. Subsequently, a metal film 33 is formed on the bottom surface of this n-type high concentration substrate 10 by an electron beam (EB) deposition method or the like. In this embodiment, although the metal film 33 is formed by the EB deposition method mentioned above, the method is not limited thereto, and the metal film 33 may also be formed using a CVD method, a sputtering method, a plating method, or the like.

The metal film 33 may be formed of a three-layered film including a Ti layer 34, a nickel (Ni) layer 35, and a gold (Au) layer 36. This metal film 33 functions as a drain electrode. As described above, the semiconductor device 1A including a super junction vertical MOSFET which has a source electrode, a drain electrode, and gate electrodes can be formed.

As described above, since the semiconductor device 1A can be formed by a method for manufacturing an epitaxial-layer filled trench groove, the process is simplified, and manufacturing can be performed at a low cost.

As described above, in the semiconductor device 1A of this embodiment, the widths of the p-type semiconductor pillar regions 22a and 22b formed from the element region A to the terminal region B are each set as the first width w1. In addition, the width of each n-type semiconductor pillar region 21a formed in the element region A and the width of each n-type semiconductor pillar region 21a connected to the resurf region C in the terminal region B are each set as the second width w2.

Furthermore, the widths of the n-type semiconductor pillar regions 21b which are formed in the terminal region B and which are not connected to the resurf region C are each set as the third width w3 smaller than the second width w2.

By the structure described above, in the terminal region of the super junction vertical MOSFET, the depletion layer can be more easily extended to the periphery of the element when the MOSFET is in an OFF state, and hence the generation of electric field concentration can be suppressed.

As a result, in the terminal region B, charge balance can be obtained, and the electric field is likely to be distributed parallel to the surface of the drain electrode and that of the source electrode. Accordingly, a stable super junction vertical MOSFET having a high withstand voltage can be provided.

In addition, since the optimal terminal region structure is realized by a method for manufacturing an epitaxial-layer filled trench groove, the impurity concentration of the n-type semiconductor pillar region 21 can be increased, and furthermore, a low on-resistance can be achieved. In addition, since the manufacturing process is simple, manufacturing can be performed at a low cost.

In addition, when the widths of some n-type semiconductor pillar regions 21b in the terminal region B are decreased, the size of the terminal region B can be efficiently reduced, and hence the chip size can also be reduced.

<Second Embodiment>

Next, a semiconductor device 1B according to a second embodiment will be described. FIGS. 7A and 7B are views each illustrating the semiconductor device 1B according to the second embodiment.

In this semiconductor device 1B, the widths of the p-type semiconductor pillar regions 22, that is, the widths of the trench grooves 25, are each the first width w1 as in the case of the semiconductor device 1A according to the first embodiment and are uniform from the element region A to the terminal region B. Since the widths of the p-type semiconductor pillar regions 22 are uniform as described above, when the trench grooves 25 are filled with a p-type semiconductor by an epitaxial growth, filling can be uniformly performed in a wafer surface.

On the other hand, the widths of the n-type semiconductor pillar regions 21 inside and outside the resurf region C are different from each other. That is, the width of each n-type semiconductor pillar region 21a in the element region A is set as the second width w2, and as in the case described above, among the n-type semiconductor pillar regions 21 in the terminal region B, the width of each n-type semiconductor pillar region 21a connected to the resurf region C is set as the second width w2. In addition, in the n-type semiconductor pillar regions 21 in the terminal region B, the width of each n-type semiconductor pillar region 21 which is not connected to the resurf region C is set as the third width w3 smaller than the second width w2.

In addition, among the p-type semiconductor pillar regions 22 in the terminal region B, $P^+$-type semiconductors 51 are formed on surfaces of the p-type semiconductor pillar regions 22b which are not connected to the resurf region C, the concentration of the P+-type semiconductor 51 being the same as that of the p-type semiconductor region 30 in the element region A.

This P+-type semiconductor 51 functions as a potential retention region, and although the p-type semiconductor pillar region 22b is depleted when a voltage is applied to the drain electrode, the surface of the p-type semiconductor pillar region 22b in contact with the potential retention region is not depleted since having a high p-type semiconductor concentration. Hence, the surface which is not depleted transmits a potential outside the MOSFET (in a direction apart from the element region A along the Y direction) while retaining the potential. That is, the region which is depleted can be further extended outside the MOSFET, thereby improving the withstand voltage.

Since the semiconductor device 1B is formed as described above, when the MOSFET is in an OFF state, the depletion layer can be extended outside further from the resurf region C. As a result, the electric field in the super junction region is uniformed, and the generation of points of electric field concentration can be suppressed, so that the withstand voltage of the MOSFET can be improved. Furthermore, a super junction vertical MOSFET which suppresses fluctuations caused by manufacturing variations can be provided.

In addition, in the semiconductor device 1B described above, the p'-type semiconductor 51 having approximately the same width as the width w1 of the p-type semiconductor pillar region 22b; however, the width of the p+-type semiconductor 51 is not limited thereto. For example, as in an semiconductor device 1B' shown in FIGS. 8A and 8B, a p+-type semiconductor 51' which has the same concentration as that of the p-type semiconductor region 30 in the element region A and has a width smaller than the width w1 of the p-type semiconductor pillar region 22b may be provided in a central portion of the p-type semiconductor pillar region 22b in the width direction (Y direction). In this semiconductor device 1B', although the potential is not likely to be transmitted outside the MOSFET as compared to that of the semiconductor device 1B, when the optimal width is selected, a more stable MOSFET having a high withstand voltage can be provided.

<Third Embodiment>

Next, a semiconductor device 1C according to a third embodiment will be described. FIGS. 9A and 9B are views each illustrating the semiconductor device 1C according to the third embodiment.

In the above semiconductor device 1B according to the second embodiment, the length of the p+-type semiconductor 51 in a long side direction (X direction) is set equal to the length of the p-type semiconductor pillar region 22 in a long side direction (X direction). On the other hand, in the semiconductor device 1C according to the third embodiment, the length of a p+-type semiconductor 52 formed on the p-type semiconductor pillar region 22b in a long side direction is set equal to the length of the resurf region C. That is, two end positions of the p+-type semiconductor 52 in the X direction are set to approximately coincide with two end positions of the resurf region C in the X direction.

In the semiconductor device 1B according to the second embodiment, since the p+-type semiconductor 51 which is the potential retention region is not depleted, a region in which an electric field strength is increased at an edge of the MOSFET may be generated, so that the p+-type semiconductor 51 may be partially responsible for a decrease in withstand voltage. On the other hand, in the semiconductor device 1C according to the third embodiment, since regions in which no p+-type semiconductors 52 are present are provided at two ends of the p-type semiconductor pillar region 22b, the above regions are depleted. Accordingly, the electric field strength is suppressed from being increased at an edge of the MOSFET. As a result, a more stable MOSFET having a high withstand voltage can be provided.

The structure described above may also be applied to the structure of the semiconductor device 1B' according to the second embodiment as shown in FIGS. 10A and 10B.

That is, as in a semiconductor device 1C' shown in FIGS. 10A and 10B, a p+-type semiconductor 52' which has the same concentration as that of the p-type semiconductor region 30 in the element region A and has a width smaller than the width w1 of the p-type semiconductor pillar region 22b may be provided in a central portion of the p-type semiconductor pillar region 22b in the width direction (Y direction). By the structure as described above, the electric field strength can be suppressed from being increased at an edge of the MOSFET, and as a result, a more stable MOSFET having a high withstand voltage can be provided.

In addition, instead of providing the potential retention regions (p+-type semiconductors 51, 51', 52, or 52') on all the p-type semiconductor pillar regions 22b, the potential retention regions may be provided on some of them. That is, the potential retention region may not be formed on a surface of at least one p-type semiconductor pillar region 22b continuously arranged in the Y direction with respect to at least two p-type semiconductor pillar regions 22b on which the potential retention regions are formed, the at least one p-type semiconductor pillar region 22b and the at least two p-type semiconductor pillar regions 22b being arranged with one of the n-type semiconductor pillar regions 21b provided therebetween. For example, as in a semiconductor device 1C" shown in FIGS. 11A and 11B, the potential retention region may not be provided on an outermost p-type semiconductor pillar region 22b, that is, on a p-type semiconductor pillar region 22b located farthest from the element region A. Since the potential retention region is present in the p-type semiconductor pillar region 22b, the potential can be more easily transmitted outside; however, when the potential retention region is not provided at the outermost side, the electric field strength can be suppressed from being increased at an edge of the MOSFET. Hence, the electric field distribution can be further uniformed, and the withstand voltage of the MOSFET can be increased.

<Fourth Embodiment>

Next, a semiconductor device 1D according to a fourth embodiment will be described. FIGS. 12A and 12B are views each illustrating the semiconductor device 1D according to the fourth embodiment.

In the semiconductor device 1D according to the fourth embodiment, as shown in FIGS. 12A and 12B, the p-type semiconductor pillar region 22b in the terminal region B is divided by n-type semiconductors 53 to form a first region 22b1 having two end positions which approximately coincide with the two end positions of the resurf region C in the X direction and second regions 22b2 located at two end sides of the first region 22b1 in the X direction. By the structure as described above, the n-type semiconductors 53 are provided at the two ends of the first region 22b1, and these regions are depleted. Furthermore, when the width of the n-type semiconductor 53 used for division is decreased than the width of the n-type semiconductor pillar region 21a in the element region A, the potential can be more easily transmitted outside the MOSFET.

In addition, as in a semiconductor device 1D' shown in FIGS. 13A and 13B, besides the structure of the above semiconductor device 1D, a p+-type semiconductor 54 may be provided as the potential retention region in a surface of the p-type semiconductor pillar region 22b which is divided into the first region 22b1 and the second regions 22b2. This p$^+$-type semiconductor 54 has an impurity concentration approximately equivalent to that of the p-type semiconductor region 30. The width of this p$^+$-type semiconductor 54 is decreased than the width of the p-type semiconductor pillar region 22b. By the structure described above, the electric field strength can be further suppressed from being increased at an edge of the MOSFET. Hence, a more stable MOSFET having a high withstand voltage can be provided. In addition, as in a semiconductor device 1D" shown in FIGS. 14A and 14B, the p$^+$-type semiconductors 54 may also be formed in some first regions 22b1 and second regions 22b2 surrounding the resurf region C.

As described above, in the semiconductor device of this embodiment, the width of the n-type semiconductor pillar region which is formed in the terminal region and which is not provided with the resurf region thereon is set smaller than the width of the n-type semiconductor pillar region in the element region.

By the structure as described above, in the terminal region of a super junction vertical MOSFET, the depletion layer can be more easily extended to the periphery of the element when the MOSFET is in an OFF state, and the generation of electric field concentration can be suppressed. As a result, in the terminal region B, the charge balance can be obtained, and the electric field is likely to be distributed parallel to the surface of the drain electrode and that of the source electrode. Hence, a stable super junction vertical MOSFET having a high withstand voltage can be provided. In addition, since the optimal terminal structure can be realized by a method for manufacturing epitaxial-layer filled trench groove, the impurity concentration of the n-type semiconductor pillar region can be increased, and further, a low on-resistance can be realized. Furthermore, since the manufacturing process is simple, manufacturing can be performed at a low cost.

Heretofore, although several embodiments of the present invention have been described in detail with reference to the accompanying drawings, these embodiments are merely described by way of example, and based on the knowledge of a person skilled in the art, the present invention may be carried out in accordance with other embodiment which are obtained by various modifications and changes.

The structure described above may be applied to any vertical operation device having a super junction structure and may also be applied to a discrete element, such as a superlattice bipolar transistor (SBT) or an insulated gate bipolar transistor (IGBT) as well as to a MOSFET. In addition, the structure may also be applied to a device using silicon carbide as a material.

The present application contains subject matter related to that disclosed in Japanese Priority Patent Application JP 2009-204662 filed in the Japan Patent Office on Sep. 4, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a first conductive type semiconductor substrate;
   a first semiconductor region provided on an upper surface of the semiconductor substrate and including a region in which first conductive type first pillar regions and second conductive type second pillar regions, each having a long side in a first direction parallel to the upper surface of the semiconductor substrate, are alternately arranged in a second direction which is parallel to the upper surface of the semiconductor substrate and which is orthogonal to the first direction;
   second conductive type second semiconductor regions provided on surfaces of second pillar regions in an element region in which a semiconductor element is formed so as to be in contact with first pillar regions in the element region;
   gate electrodes, each provided on parts of adjacent second semiconductor regions and on one of the first pillar regions interposed therebetween with a gate insulating film provided under the gate electrodes;
   third semiconductor regions, each functioning as a first conductive type source region provided in parts of the second semiconductor regions located under side portions of the gate electrodes; and
   a second conductive type resurf region which is a part of a terminal region surrounding the element region and which is provided on first pillar regions and second pillar regions in the part of the terminal region, wherein,
      the widths of the second pillar regions provided from the element region to the terminal region are each set as a first width,
      the widths of the first pillar regions provided in the element region and the widths of the first pillar regions connected to the resurf region in the terminal region are each set as a second width, and
      the widths of first pillar regions which are provided in the terminal region and which are not provided with the resurf region thereon are each set smaller than the second width.

2. The semiconductor device according to claim 1, further comprising second conductive type semiconductors provided on surfaces of at least two second pillar regions which are continuously arranged in the second direction with respect to the second pillar regions connected to the resurf region with one of the first pillar regions provided therebetween, the at least two second pillar regions being among second pillar regions which are provided in the terminal region and which are not connected to the resurf region, the second conductive type semiconductors each having an impurity concentration higher than that of each of the at least two second pillar regions.

3. The semiconductor device according to claim 2, wherein the widths of the second conductive type semiconductors are each smaller than the width of each of the at least two second pillar regions provided thereunder.

4. The semiconductor device according to claim 2 or 3, wherein the second conductive type semiconductors are each provided so that two end positions thereof in the first direction approximately coincide with two end positions of the resurf region in the first direction.

5. The semiconductor device according to claim 4, wherein, with respect to the at least two second pillar regions on which the second conductive type semiconductors are provided, at least one second pillar region continuously arranged in the second direction is provided with no second conductive type semiconductor thereon, the at least two second pillar regions and the at least one second pillar region being arranged with one of the first pillar regions provided therebetween.

6. The semiconductor device according to claim 4, wherein second pillar regions which are provided in the terminal region are each divided by a first conductive type semiconductor having a width smaller than the width of each of the first pillar regions in the element region into a first region having two end positions which approximately coincide with two end positions of the resurf region in the first direction and second regions located at two ends of the first region in the first direction.

7. The semiconductor device according to claim 4, wherein the first semiconductor region is a region formed by a process including the steps of forming a plurality of trench grooves in a first conductive type semiconductor layer provided on the upper surface of the semiconductor substrate to form the first pillar regions between the trench grooves and filling a second conductive type semiconductor in the trench grooves by an epitaxial growth to form the second pillar regions.

8. The semiconductor device according to one of claims 2 or 3, wherein, with respect to the at least two second pillar regions on which the second conductive type semiconductors are provided, at least one second pillar region continuously arranged in the second direction is provided with no second conductive type semiconductor thereon, the at least two second pillar regions and the at least one second pillar region being arranged with one of the first pillar regions provided therebetween.

9. The semiconductor device according to claim 8, wherein the first semiconductor region is a region formed by a process including the steps of forming a plurality of trench grooves in a first conductive type semiconductor layer provided on the upper surface of the semiconductor substrate to form the first pillar regions between the trench grooves and filling a second conductive type semiconductor in the trench grooves by an epitaxial growth to form the second pillar regions.

10. The semiconductor device according to one of claims 1 to 3, wherein second pillar regions which are provided in the terminal region are each divided by a first conductive type semiconductor having a width smaller than the width of each of the first pillar regions in the element region into a first region having two end positions which approximately coincide with two end positions of the resurf region in the first direction and second regions located at two ends of the first region in the first direction.

11. The semiconductor device according to claim 10, wherein the first semiconductor region is a region formed by a process including the steps of forming a plurality of trench grooves in a first conductive type semiconductor layer provided on the upper surface of the semiconductor substrate to form the first pillar regions between the trench grooves and filling a second conductive type semiconductor in the trench grooves by an epitaxial growth to form the second pillar regions.

12. The semiconductor device according to one of claims 1 to 3, wherein the first semiconductor region is a region formed by a process including the steps of forming a plurality of trench grooves in a first conductive type semiconductor layer provided on the upper surface of the semiconductor substrate to form the first pillar regions between the trench grooves and filling a second conductive type semiconductor in the trench grooves by an epitaxial growth to form the second pillar regions.

13. A method for manufacturing a semiconductor device comprising the steps of:
  forming a first conductive type semiconductor layer on a first conductive type semiconductor substrate;
  forming trench grooves in the first conductive type semiconductor layer to form first conductive type first pillar regions between the trench grooves, the grooves each having a long side in a first direction parallel to an upper surface of the semiconductor substrate and being arranged in a second direction which is parallel to the upper surface of the semiconductor substrate and which is orthogonal to the first direction;
  filling a second conductive type semiconductor in the trench grooves by an epitaxial growth to form second conductive type second pillar regions;
  forming second conductive type second semiconductor regions on surfaces of second pillar regions in an element region in which a semiconductor element is formed so as to be in contact with first pillar regions in the element region;
  forming gate electrodes each provided on parts of adjacent second semiconductor regions and on one of the first pillar region interposed therebetween with a gate insulating film provided under the gate electrodes;
  forming third semiconductor regions each functioning as a first conductive type source region in parts of the second semiconductor regions located under side portions of the gate electrodes; and
  forming a second conductive type resurf region which is a part of a terminal region surrounding the element region on first pillar regions and second pillar regions in the part of the terminal region,
  wherein in the step of forming trench grooves, the widths of the second pillar regions formed from the element region to the terminal region are each set as a first width, the widths of the first pillar regions formed in the element region and the widths of the first pillar regions connected to the resurf region in the terminal region are each set as a second width, and the widths of first pillar regions which are formed in the terminal region and which are not provided with the resurf region thereon are set smaller than the second width.

* * * * *